US011380606B2

(12) United States Patent
Kim et al.

(10) Patent No.: US 11,380,606 B2
(45) Date of Patent: Jul. 5, 2022

(54) SEMICONDUCTOR DEVICE INCLUDING VIA STRUCTURE WITH HEAD AND BODY PORTIONS

(71) Applicant: SAMSUNG ELECTRONICS CO., LTD., Suwon-si (KR)

(72) Inventors: Eunji Kim, Suwon-si (KR); Sungdong Cho, Suwon-si (KR); Kwangwuk Park, Suwon-si (KR); Sangjun Park, Suwon-si (KR); Daesuk Lee, Suwon-si (KR); Hakseung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/932,726

(22) Filed: Jul. 18, 2020

(65) Prior Publication Data

US 2021/0020545 A1 Jan. 21, 2021

(30) Foreign Application Priority Data

Jul. 19, 2019 (KR) .................. 10-2019-0087761

(51) Int. Cl.
| | |
|---|---|
| *H01L 23/48* | (2006.01) |
| *H01L 21/768* | (2006.01) |
| *H01L 25/18* | (2006.01) |
| *H01L 23/528* | (2006.01) |
| *H01L 23/498* | (2006.01) |
| *H01L 23/522* | (2006.01) |
| *H01L 21/3065* | (2006.01) |

(52) U.S. Cl.
CPC ...... *H01L 23/481* (2013.01); *H01L 21/76898* (2013.01); *H01L 25/18* (2013.01); *H01L 21/3065* (2013.01)

(58) Field of Classification Search
CPC ........... H01L 21/76898; H01L 21/3065; H01L 25/18; H01L 23/481; H01L 23/5283; H01L 23/49838; H01L 23/49827; H01L 23/5226; H01L 2225/06544
See application file for complete search history.

(56) References Cited

U.S. PATENT DOCUMENTS

| | | | |
|---|---|---|---|
| 7,803,714 B2 | 9/2010 | Ramiah et al. | |
| 8,035,193 B2 | 10/2011 | Ding et al. | |
| 8,658,531 B2 | 2/2014 | Yang et al. | |
| 8,963,319 B2 | 2/2015 | Tsumura et al. | |
| 9,318,438 B2 | 4/2016 | Bossler et al. | |
| 9,991,215 B1 | 6/2018 | Lin | |
| 2008/0305628 A1 | 12/2008 | Hayashi et al. | |
| 2009/0243074 A1* | 10/2009 | Ramiah ................. | H01L 23/481 257/686 |

(Continued)

*Primary Examiner* — Herve-Louis Y Assouman
(74) *Attorney, Agent, or Firm* — F. Chau & Associates, LLC

(57) ABSTRACT

A semiconductor device includes a semiconductor substrate having an active surface on which semiconductor elements are provided. An interlayer insulating film is provided on the semiconductor substrate. A first via structure passes through the semiconductor substrate. The first via structure has a first diameter. A second via structure passes through the semiconductor substrate. The second via structure has a second diameter that is greater than the first diameter. The first via structure has a step portion that is in contact with the interlayer insulating film.

18 Claims, 22 Drawing Sheets

(56) References Cited

U.S. PATENT DOCUMENTS

| | | | |
|---|---|---|---|
| 2012/0112361 A1* | 5/2012 | Han | H01L 23/147 |
| | | | 257/774 |
| 2013/0093098 A1* | 4/2013 | Yang | H01L 23/5226 |
| | | | 257/774 |
| 2015/0061083 A1* | 3/2015 | Yeh | H01L 21/743 |
| | | | 257/621 |
| 2017/0053872 A1* | 2/2017 | Lee | H01L 21/76898 |
| 2018/0090453 A1 | 3/2018 | Kazue et al. | |
| 2018/0165402 A1* | 6/2018 | Farooq | G06F 30/394 |
| 2018/0286751 A1 | 10/2018 | Wietstruck et al. | |
| 2018/0315648 A1 | 11/2018 | Ke et al. | |
| 2018/0374744 A1 | 12/2018 | Wu et al. | |

* cited by examiner

SEMICONDUCTOR DEVICE INCLUDING VIA STRUCTURE WITH HEAD AND BODY PORTIONS

CROSS-REFERENCE TO RELATED APPLICATION

This application claims the benefit of and priority to Korean Patent Application No. 10-2019-0087761, filed on Jul. 19, 2019, in the Korean Intellectual Property Office, the disclosure of which is incorporated by reference herein in its entirety.

TECHNICAL FIELD

The present disclosure relates to a semiconductor device and a semiconductor package, and more particularly, to a semiconductor device and a semiconductor package, which process data at high speed and have low power consumption.

DISCUSSION OF THE RELATED ART

With the brisk development of three-dimensional (3D) packages in which a plurality of semiconductor chips are stacked horizontally and mounted together in one semiconductor package, a through-silicon via (TSV) technique of forming vertical electrical connection through a substrate or a die has gained traction.

SUMMARY

According to an aspect of the inventive concept, a semiconductor device includes a semiconductor substrate having an active surface on which semiconductor elements are provided. An interlayer insulating film is provided on the semiconductor substrate. A first via structure is configured to pass through the semiconductor substrate. The first via structure has a first diameter. A second via structure is configured to pass through the semiconductor substrate. The second via structure has a second diameter that is greater than the first diameter. The first via structure includes a head portion having a first width in a direction parallel to an upper surface of the semiconductor substrate. A body portion has a second width in the direction parallel to the upper surface of the semiconductor substrate. The second width is less than the first width. A step portion is in contact with the interlayer insulating film between the head portion and the body portion. A lower surface of the head portion is substantially parallel to the upper surface of the semiconductor substrate.

According to an aspect of the inventive concept, a semiconductor device includes a semiconductor substrate. An interlayer insulating film is provided on the semiconductor substrate. A signal via structure is configured to pass through the semiconductor substrate and the interlayer insulating film. A power via structure is configured to pass through the semiconductor substrate and the interlayer insulating film. The power via structure extends and passes through a device isolation film in the semiconductor substrate. The signal via structure includes a head portion having a first width in a direction parallel to an upper surface of the semiconductor substrate, and a body portion having a second width in the direction parallel to the upper surface of the semiconductor substrate. The second width is smaller than the first width. A lower surface of the head portion is substantially parallel to the upper surface of the semiconductor substrate.

According to an aspect of the inventive concept, a semiconductor package includes a first semiconductor device including a cell region and a peripheral region, and a second semiconductor device stacked on the first semiconductor device. The second semiconductor device is electrically connected to the first semiconductor device. The first semiconductor device includes a semiconductor substrate and an interlayer insulating film provided on the semiconductor substrate. The first semiconductor device includes a first via structure and a second via structure disposed in the peripheral region. The first via structure passes through the semiconductor substrate and has a first diameter. The second via structure passes through the semiconductor substrate and has a second diameter, which is greater than the first diameter. A sidewall of a via hole of the first via structure includes at least one undercut portion. The first via structure includes a head portion having a first width in a direction parallel to an upper surface of the semiconductor substrate, and a body portion having a second width in the direction parallel to the upper surface of the semiconductor substrate. The second width is less than the first width. A lower surface of the head portion is substantially parallel to the upper surface of the semiconductor substrate.

BRIEF DESCRIPTION OF THE DRAWINGS

A more complete appreciation of the present disclosure and many of the attendant aspects thereof will be more clearly understood from the following detailed description taken in conjunction with the accompanying drawings, in which.

DETAILED DESCRIPTION OF THE EMBODIMENTS

Figure 1:
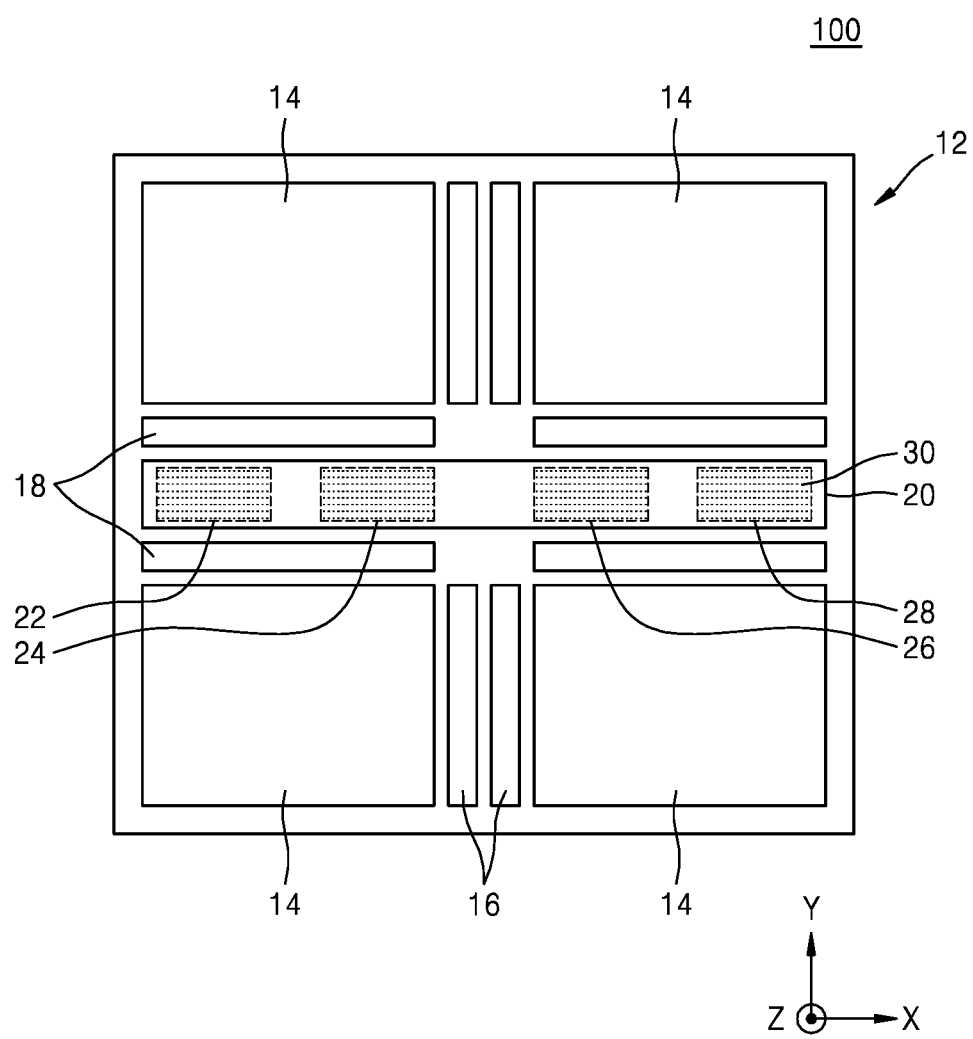
FIG. 1 is a planar layout illustrating a semiconductor device according to exemplary embodiments of the present disclosure.

Hereinafter, exemplary embodiments of the present disclosure will be described in detail with reference to the accompanying drawings. The same reference numerals may be used to denote the same or similar elements in the drawings, and to the extent that repeated descriptions thereof is omitted, it may be assumed that the omitted elements are at least similar to the corresponding elements for which a detailed description has already been provided herein.

FIG. 1 is a planar layout illustrating a semiconductor device 100 according to exemplary embodiments of the present disclosure.

Referring to FIG. 1, the semiconductor device 100 may include a semiconductor chip 12 including a plurality of cell regions 14. A plurality of memory cells may be arranged in each of the plurality of cell regions 14. A plurality of word lines, a plurality of bit lines, and a sense amplifier may be arranged in various manners within the plurality of cell regions 14. A peripheral region may be provided at least partially surrounding each of the plurality of cell regions 14. The peripheral region may include a plurality of column decoders 16, a plurality of row decoders 18, and a through-silicon via (TSV) region 20. The plurality of column decoders 16 may receive an address, decode the address, and select a column line of the cell region 14. The plurality of row decoders 18 may receive an address, decode the address, and output a row address for selecting a row line of the cell region 14. The memory chip 12 may further include a write driver, an input/output (I/O) sense amplifier, and an I/O buffer.

The TSV region 20 may be in an approximately central portion of the memory chip 12. A plurality of TSV structures 30 may be arranged in the TSV region 20. The number and shape of the plurality of TSV structures 30 shown in FIG. 1 are merely exemplary, and the inventive concept is not limited to those shown in FIG. 1. For example, about hundreds to thousands of TSV structures 30 may be disposed in the TSV region 20.

The I/O buffer included in the memory chip 12 may receive an external signal through the TSV structure 30 or transmit a signal to the outside through the TSV structure 30.

The TSV region 20 may include a plurality of TSV unit regions. For example, the TSV region 20 may include a first TSV unit region 22, a second TSV unit region 24, a third TSV unit region 26, and a fourth TSV unit region 28. Although FIG. 1 illustrates an example in which the TSV region 20 includes four TSV unit regions, for example, the first to fourth TSV unit regions 22, 24, 26, and 28, the inventive concept is not limited to the example shown in FIG. 1. The TSV region 20 may include various different numbers of TSV unit regions.

Figure 2:
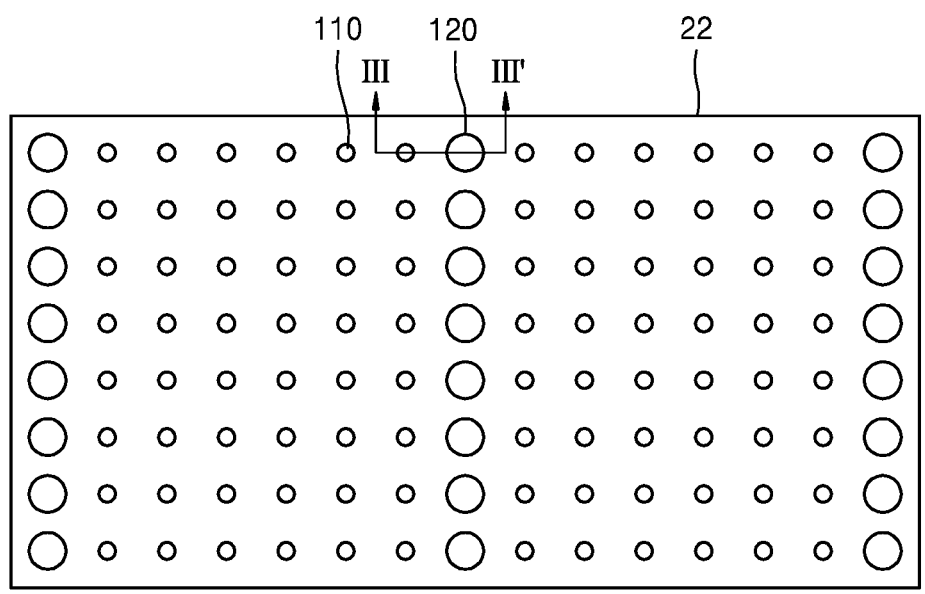
FIG. 2 is an enlarged view illustrating a through-silicon via (TSV) unit region of FIG. 1.

FIG. 2 is an enlarged view illustrating a first TSV unit region 22 of FIG. 1. Although the first TSV unit region 22 is shown in FIG. 2, it will be understood to one skilled in the art that each of the second TSV unit region 24, the third TSV unit region 26, and the fourth TSV unit region 28 may also be of the same structure as the first TSV unit region 22.

Referring to FIG. 2, the first TSV unit region 22 may include a plurality of via structures. For example, the first TSV unit region 22 may include a first via structure 110 having a relatively small diameter and a second via structure 120 having a relatively large diameter.

Since the second via structure 120 has the relatively large diameter, the second via structure 120 may have a lower resistance and supply power more efficiently as compared to the first via structure 110. Since the first via structure 110 has the relatively small diameter, the first via structure 110 may have a lower capacitance and provide a higher data transmission rate as compared to the second via structure 120.

In some exemplary embodiments of the present disclosure, a plurality of first via structures 110 serving as a signal transmission path may be arranged in a lattice form, while a plurality of second via structures 120 serving as a power transmission path may be arranged in a straight form. However, the inventive concept is not limited to this particular arrangement.

Figure 3:
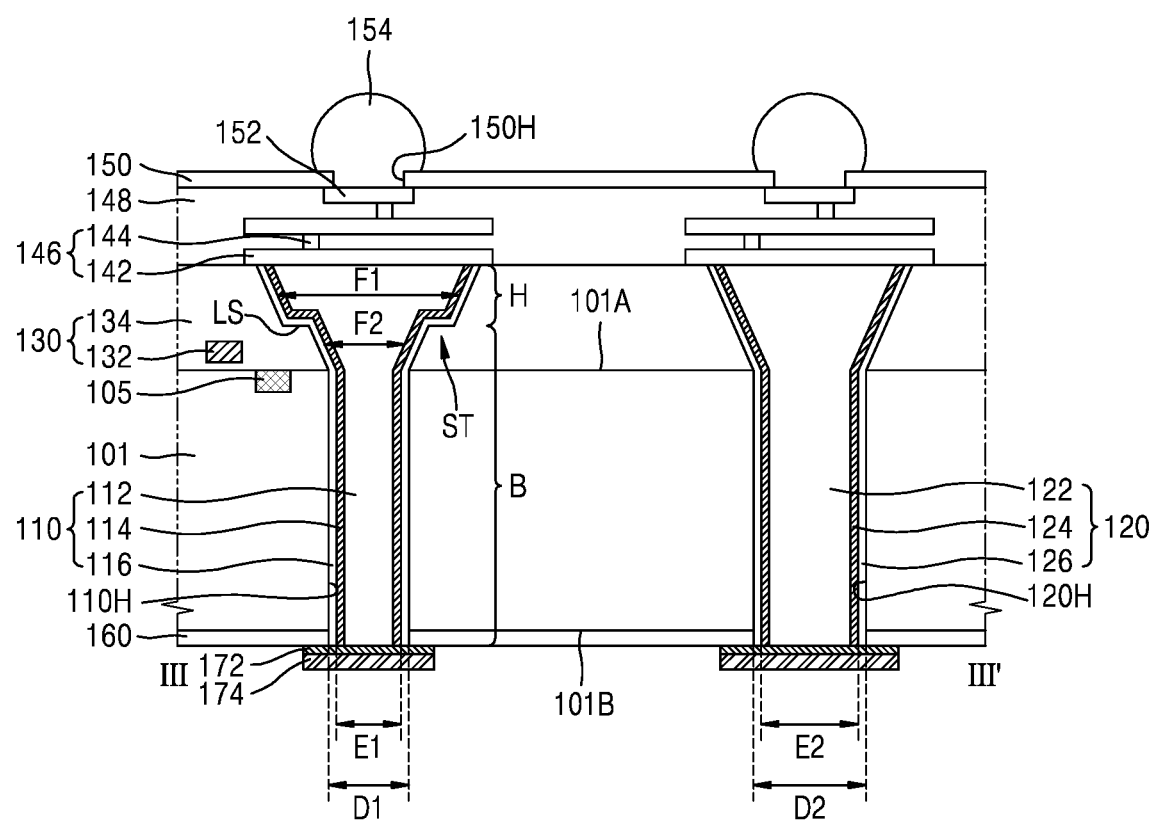
FIG. 3 is a side cross-sectional view taken along a line III-III' of FIG. 2, in a semiconductor device according to an exemplary embodiment of the present disclosure.

FIG. 3 is a side cross-sectional view taken along a line III-III' of FIG. 2, in a semiconductor device 100 according to an exemplary embodiment of the present disclosure.

Referring to FIG. 3, the semiconductor device 100 may include a semiconductor substrate 101, an interlayer insulating film 134 formed on the semiconductor substrate 101, a first via structure 110 configured to pass through the semiconductor substrate 101, and a second via structure 120 configured to pass through the semiconductor substrate 101.

The semiconductor substrate 101 may include a semiconductor, such as silicon (Si) and/or germanium (Ge), or a compound semiconductor, such as silicon carbide (SiC), gallium arsenide (GaAs), indium arsenide (InAs), and/or indium phosphide (InP). In at least one embodiment, the semiconductor substrate 101 may have a silicon-on-insulator (SOI) structure. For example, the semiconductor substrate 101 may include a buried oxide (BOX) layer. In some exemplary embodiments of the present disclosure, the semiconductor substrate 101 may include a conductive region, for example, a doped well or a doped structure. Also, the semiconductor substrate 101 may have various device isolation films, such as a shallow trench isolation (STI) structure.

The interlayer insulating film 134 may include a single material layer or a multi-layered material structure in which at least two material layers are stacked. In some exemplary embodiments of the present disclosure, the interlayer insulating film 134 may include a tetraethyl orthosilicate (TEOS) film, a high-density plasma (HDP) film, a boro-phosphosilicate glass (BPSG) film, a flowable chemical vapor deposition (FCVD) oxide film, or an ultralow K (ULK) film having an ultralow dielectric constant K of about 2.2 to about 2.4. The ULK film may include, for example, a silicon oxycarbide (SiOC) film or a carbon-doped silicon oxide (SiCOH) film. In some exemplary embodiments of the present disclosure, the interlayer insulating film 134 may include a silicon nitride (SiN) film or a silicon oxynitride (SiON) film.

A plurality of various kinds of semiconductor elements 132 may be provided in the interlayer insulating film 134 and the semiconductor substrate 101. The semiconductor elements 132 may include various microelectronic devices, for example, metal-oxide-semiconductor field effect transistors (MOSFETs), system large-scale integration (LSI), image sensors (e.g., CMOS imaging sensors (CISs)), micro-electro-mechanical system (MEMS), active elements, and passive elements. The semiconductor elements 132 may be electrically connected to a conductive region of the semiconductor substrate 101. In addition, each of the semiconductor elements 132 may be electrically isolated from other adjacent semiconductor elements by a device isolation film 105.

The device isolation film 105 may include a single material layer or a multi-layered material structure in which at least two material layers are stacked upon each other. In some exemplary embodiments of the present disclosure, the device isolation film 105 may have an STI structure. In some exemplary embodiments of the present disclosure, an upper surface of the device isolation film 105 may be substantially coplanar with an upper surface 101A of the semiconductor substrate 101. In some exemplary embodiments of the present disclosure, the device isolation film 105 may include silicon oxide, silicon nitride, silicon oxynitride, or a combination thereof. Although only one device isolation film 105 is shown in FIG. 3, it will be understood to one skilled in the art that a plurality of device isolation films 105 may be provided.

The first via structure 110 may include a first via insulating film 116 with which a sidewall of a first via hole 110H is coated, a first barrier film 114 with which a sidewall of the first via insulating film 116 is coated, and a first via plug 112 configured to fill an inner space defined by the first barrier film 114.

In some exemplary embodiments of the present disclosure, the first via insulating film 116 may extend to a substantially uniform thickness along the sidewall of the first via hole 110H. The first via insulating film 116 may include an oxide film, a nitride film, a carbide film, a polymer, or a combination thereof. In some exemplary embodiments of the present disclosure, the first via insulating film 116 may be formed using a chemical vapor deposition (CVD) process. In some exemplary embodiments of the present disclosure, the first via insulating film 116 may have a thickness of about 500 angstroms (Å) to about 1000 Å.

In some exemplary embodiments of the present disclosure, the first barrier film 114 may extend to a substantially uniform thickness along a sidewall of the first via insulating film 116. The first barrier film 114 may include a conductive layer having a relatively low interconnection resistance. For example, the first barrier film 114 may include a single film or a multi-layered structure including tungsten (W), tungsten nitride (WN), tungsten carbide (WC), titanium (Ti), titanium nitride (TiN), tantalum (Ta), tantalum nitride (TaN), ruthenium (Ru), cobalt (Co), manganese (Mn), tungsten nitride (WN), nickel (Ni), and/or nickel boron (NiB). For instance, the first barrier film 114 may have a multi-layered structure including TaN/W, TiN/W, or WN/W. The first barrier film 114 may have a thickness of about 500 Å to about 1000 Å. In some exemplary embodiments of the present disclosure, the first barrier film 114 may be formed using a physical vapor deposition (PVD) process, a CVD process, or an atomic layer deposition (ALD) process, but the inventive concept is not limited thereto.

The second via structure 120 may include a second via insulating film 126 with which a sidewall of a second via hole 120H is coated, a second barrier film 124 with which a sidewall of the second via insulating film 126 is coated, and a second via plug 122 configured to fill an inner space defined by the second barrier film 124.

The second via insulating film 126, the second barrier film 124, and the second via plug 122 may be substantially the same as the first via insulating film 116, the first barrier film 114, and the first via plug 112, respectively. Since the first via insulating film 116, the first barrier film 114, and the first via plug 112 have been described in detail above, detailed descriptions of the second via insulating film 126, the second barrier film 124, and the second via plug 122 will be omitted here and it may be assumed that the omitted descriptions are at least similar to the corresponding elements for which a detailed description has already been provided herein.

In some exemplary embodiments of the present disclosure, the first via structure 110 may include a head portion H and a body portion B. The head portion H and the body portion B may be connected to each other. In some exemplary embodiments of the present disclosure, the head portion H may be integrally formed with the body portion B. The head portion H may have a planar form, for example, in the form of circles, polygons, and ellipses. However, the inventive concept is not limited thereto.

In a direction parallel to the upper surface 101A of the semiconductor substrate 101, the head portion H may have a first width F1, and the body portion B may have a second width F2 that is less than the first width F1. Each of the first width F1 and the second width F2 may be changed according to a position of the first via structure 110 in a vertical direction (or a lengthwise direction of FIG. 3). Even if the first width F1 and the second width F2 are changed according to the position of the first via structure 110, a minimum value of the first width F1 may be greater than a maximum value of the second width F2. The first width F1 may be increased in a direction away from the body portion B.

The first via structure 110 may have a step portion in contact with the interlayer insulating film 134. The step portion may be defined by the head portion H and the body portion B, which have different widths in a lateral direction (or a widthwise direction of FIG. 3). Meanwhile, the second via structure 120 might not include the step portion. The second via structure 120 may have a shape such that a width of the second via structure 120 in the lateral direction is constantly changed within the interlayer insulating film 134.

A sidewall of the head portion H may be in contact with the interlayer insulating film 134. A lower surface LS of the head portion H may also be in contact with the interlayer insulating film 134. The lower surface LS of the head portion H may be substantially parallel to the upper surface 101A of the semiconductor substrate 101.

An upper portion of the body portion B may be in contact with the interlayer insulating film 134, and the other portion of the body portion B may be in contact with the semiconductor substrate 101.

In some exemplary embodiments of the present disclosure, the lower surface LS of the head portion H may be at a higher level than an upper surface of the semiconductor element 132.

The first via structure 110 may have a first diameter D1, and the second via structure 120 may have a second diameter D2, which is greater than the first diameter D1. In some exemplary embodiments of the present disclosure, the second diameter D2 may be greater than the first diameter D1 by about 1 μm to about 5 μm. The first diameter D1 and the second diameter D2 may be an outer diameter of the first via insulating film 116 and an outer diameter of the second via insulating film 126, respectively.

The first barrier film 114 of the first via structure 110 may have a first barrier width E1, and the second barrier film 124 of the second via structure 120 may have a second barrier width E2. In some exemplary embodiments of the present disclosure, the second barrier width E2 may be greater than the first barrier width E1. In some exemplary embodiments of the present disclosure, the second barrier width E2 may be greater than the first barrier width E1 by about 1 μm to about 4 μm.

One end of each of the first via structure 110 and the second via structure 120 may be electrically connected to a multi-layered interconnection structure 146 including a plurality of metal interconnection layers 142 and a plurality of contact plugs 144. Although FIG. 3 illustrates a case in which the multi-layered interconnection structure 146 is in direct contact with the first via structure 110 and the second via structure 120, the multi-layered interconnection structure 146 may be electrically connected to the first via structure 110 and the second via structure 120 through another conductor. In addition, the plurality of multi-layered interconnection structures 146 may be insulated from each other by an inter-metal dielectric (IMD) film 148.

In some exemplary embodiments of the present disclosure, an upper insulating film 150 may be formed on the IMD film 148. The upper insulating film 150 may include a silicon oxide film, a silicon nitride film, a polymer, or a combination thereof. Holes 150H may be formed in the upper insulating film 150 and may expose bonding pads 152 connected to the multi-layered interconnection structures 146. The bonding pads 152 may be connected to upper connection terminals through the holes 150H.

Another end of each of the first via structure 110 and the second via structure 120 may be coated with a conductive layer 172. Coupling terminals 174 may be electrically connected to the first via structure 110 and the second via structure 120 through the conductive layer 172.

Upper connection terminals 154 and the coupling terminal 174 are not limited to shapes shown in FIG. 3. Each of the upper connection terminals 154 and the coupling terminals 174 may be provided as a conductive pad, a solder ball, a solder bump, or a redistribution conductive layer. In some exemplary embodiments of the present disclosure, the upper connection terminals 154 may be omitted from the semiconductor device 100 according to the present embodiment.

Figure 4:
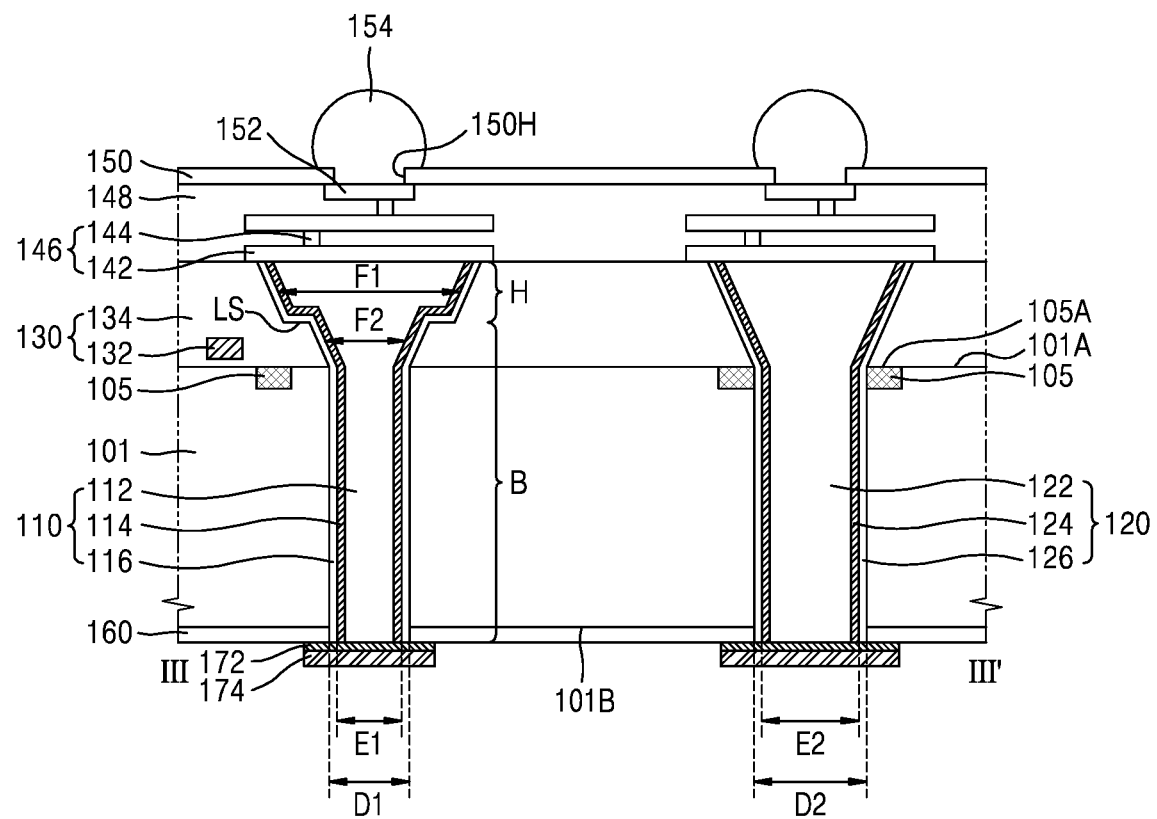
FIG. 4 is a side cross-sectional view taken along a line III-III' of FIG. 2, in a semiconductor device according to an exemplary embodiment of the present disclosure.

FIG. 4 is a side cross-sectional view taken along a line III-III' of FIG. 2, in a semiconductor device according to an exemplary embodiment of the present disclosure. The embodiment shown in FIG. 4 may be substantially the same as the embodiment shown in FIG. 3 except that a second via structure 120 is surrounded by a device isolation film 105. Accordingly, differences between the embodiments shown in FIGS. 3 and 4 will mainly be described in detail and it may be assumed that those elements not disclosed herein are at least similar to corresponding elements that are described in detail elsewhere within the instant application.

Referring to FIG. 4, the second via structure 120 may pass through the device isolation film 105. As described with reference to FIG. 3, a plurality of device isolation films 105 may be provided in a semiconductor substrate 101. The second via structure 120 may extend to pass through one of the plurality of device isolation films 105 in a vertical direction.

The device isolation film 105 is configured to pass through the second via structure 120 and may surround a side surface of the second via structure 120 over a partial height of the second via structure 120. For example, the device isolation film 105 may be in contact with the side surface of the second via structure 120 and may surround the second via structure 120 in a lateral direction over the partial height of the second via structure 120. In some exemplary embodiments of the present disclosure, a second via insulating film 126 of the second via structure 120 may be in contact with the device isolation film 105 configured to pass through the second via structure 120.

Figure 5:
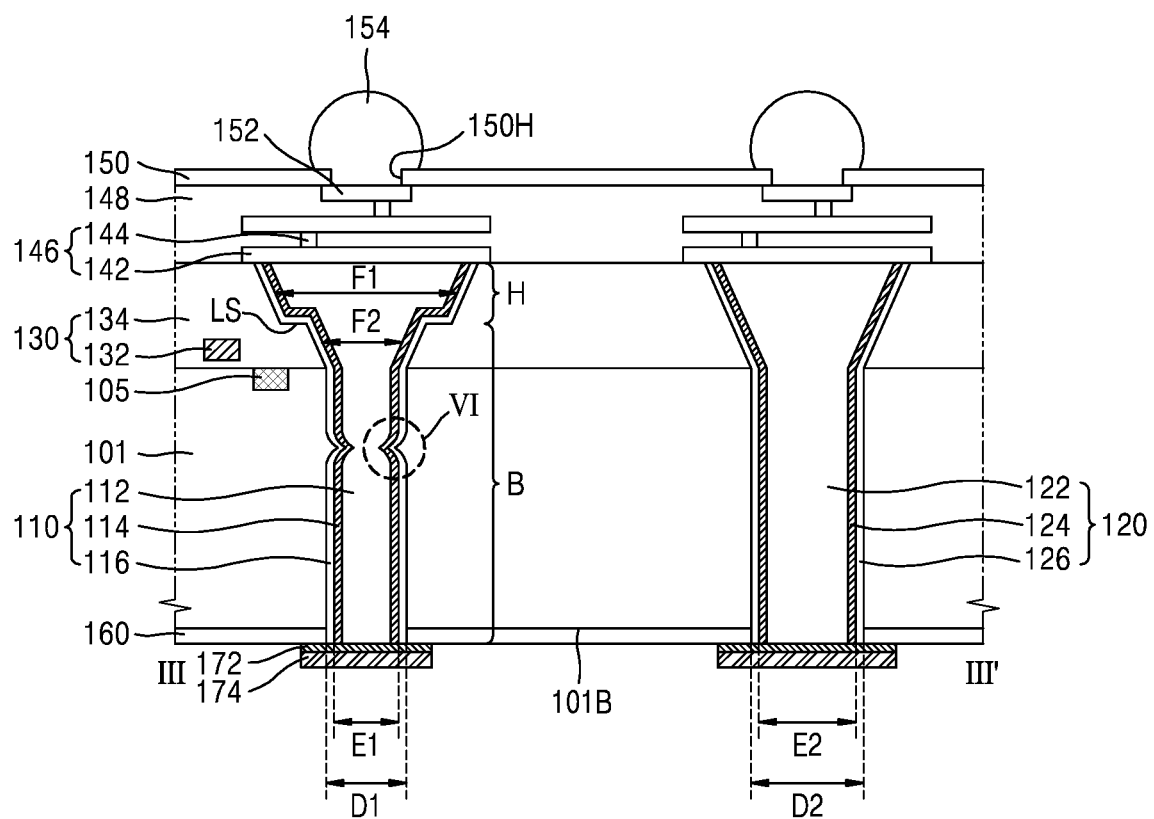
FIG. 5 is a side cross-sectional view taken along a line III-III' of FIG. 2, in a semiconductor device according to an exemplary embodiment of the present disclosure.

FIG. 5 is a side cross-sectional view taken along a line III-III' of FIG. 2, in a semiconductor device according to an exemplary embodiment of the present disclosure. The embodiment shown in FIG. 5 may be substantially the same as the embodiment shown in FIG. 3 except that a sidewall of a first via hole 110H is configured to contain a first via structure 110 and the sidewall of the first via hole 110H has an undercut portion. Accordingly, differences between the embodiments shown in FIGS. 3 and 5 will mainly be described in detail and it may be assumed that those elements not disclosed herein are at least similar to corresponding elements that are described in detail elsewhere within the instant application.

Referring to FIG. 5, in some exemplary embodiments of the present disclosure, the sidewall of the first via hole 110H may include at least one undercut portion. The undercut portion may refer to a portion that protrudes toward a center of the first via hole 110H. The first via hole 110H may be formed using a method, such as a deep reactive ion etching (DRIE) process, as described below. In this case, a finely rough portion may be formed on the sidewall of the first via hole 110H, and the undercut portion may markedly protrude as compared to the finely rough portion.

FIG. 5 illustrates a case in which the first via hole 110H includes one undercut portion, but the inventive concept is not limited thereto. The first via hole 110H may include at least two undercut portions, for example, two or more undercut portions.

Figure 6A:
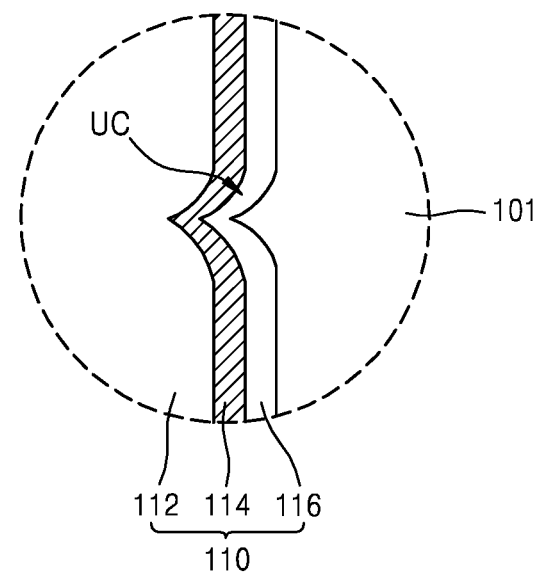
FIGS. 6A and 6B are detailed enlarged partial views of region VI of FIG. 5.
Figure 6B:
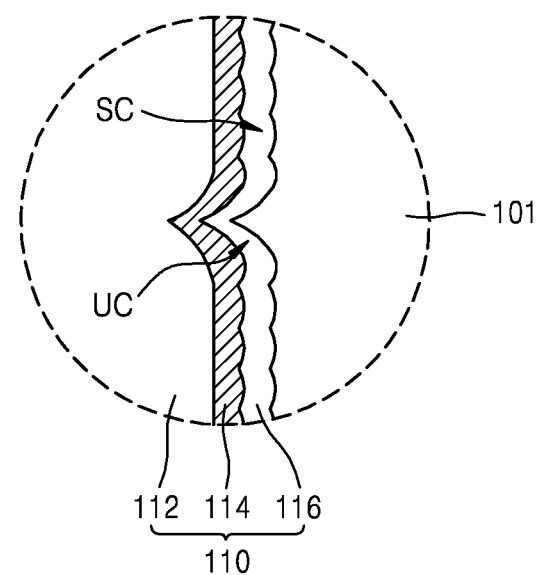

FIGS. 6A and 6B are detailed enlarged partial views of region VI of FIG. 5.

Referring to FIG. 6A, an undercut portion UC having a protruding shape may be provided at the first via hole 110H. Due to the protruding shape of the undercut portion UC, a first via insulating film 116 and a first barrier film 114, which are sequentially stacked on the undercut portion UC, may also have protruding shapes. Since each of the first via insulating film 116 and the first barrier film 114 is conformally formed to a substantially constant thickness, the protruding shape of the undercut portion US of the first via hole 110H may be identically or similarly inherited to the first via insulating film 116 and the first barrier film 114.

Referring to FIG. 6B, a plurality of scallops SC and an undercut portion UC having a protruding shape may be provided at the first via hole 110H. The first via hole 110H may be formed using a Bosch process. For example, to form the first via hole 110H in the semiconductor substrate 101, an inductive coupled plasma (ICP) DRIE process using $SF_6$ or $O_2$ plasma and a sidewall passivation process using any one of the $CF_x$ series, such as $C_4F_8$, may be repeated several times. As a result, the first via hole 110H having a plurality of scallops SC may be formed as shown in FIG. 6B.

Due to protruding shapes of the scallops SC and the undercut portion UC, the first via insulating film 116 and the first barrier film 114, which are sequentially stacked on the scallops SC and the undercut portion UC, may also have shapes corresponding to the protruding shapes of the scallops SC and the undercut UC.

Rough portions of the scallops SC at an interface between the first via insulating film 116 and the first barrier film 114 may be reduced as compared to a sidewall of the first via hole 110H. In some exemplary embodiments of the present disclosure, an interface between the first via plug 112 and the first barrier film 114 may have a portion to which the rough portions of the scallops SC are not inherited.

Figure 7:
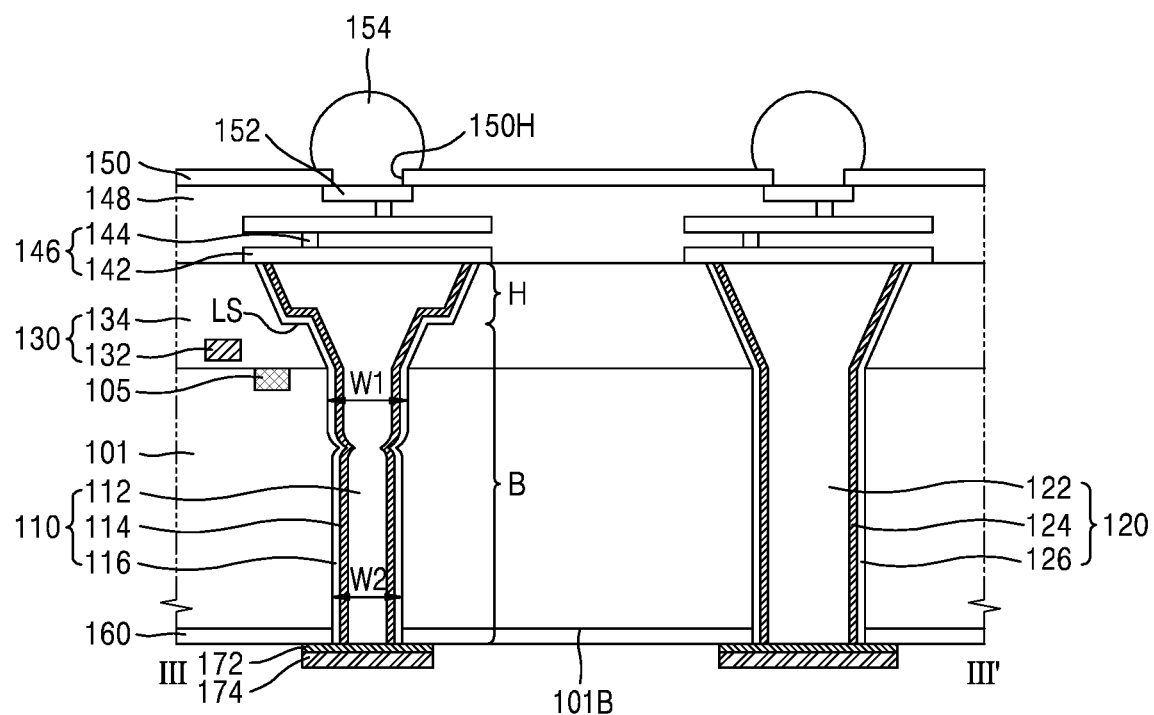
FIG. 7 is a side cross-sectional view taken along a line III-III' of FIG. 2, in a semiconductor device according to an exemplary embodiment of the present disclosure.

FIG. 7 is a side cross-sectional view taken along a line III-III' of FIG. 2, in a semiconductor device according to an exemplary embodiment of the present disclosure. The embodiment shown in FIG. 7 may be substantially the same as the embodiment shown in FIG. 3 except that a sidewall of a first via hole 110II configured to contain a first via structure 110 has an undercut portion and the first via structure 110 has different diameters at an upper portion and a lower portion of the undercut portion. Accordingly, differences between the embodiments shown in FIGS. 3 and 7 will mainly be described in detail and it may be assumed that those elements not disclosed herein are at least similar to corresponding elements that are described in detail elsewhere within the instant application.

Referring to FIG. 7, the sidewall of the first via hole 110H may have the undercut portion, and the first via structure 110 may have a first width W1 at the upper portion of the undercut portion and have a second width W2 at the lower portion of the undercut portion. The first width W1 may be different from the second width W2. In some exemplary embodiments of the present disclosure, the first width W1 may be greater than the second width W2. In other embodiments, the first width W1 may be less than the second width W2.

Each of the first width W1 and the second width W2 may be less than the second diameter (refer to D2 in FIG. 3) of the second via structure 120.

Figure 8:
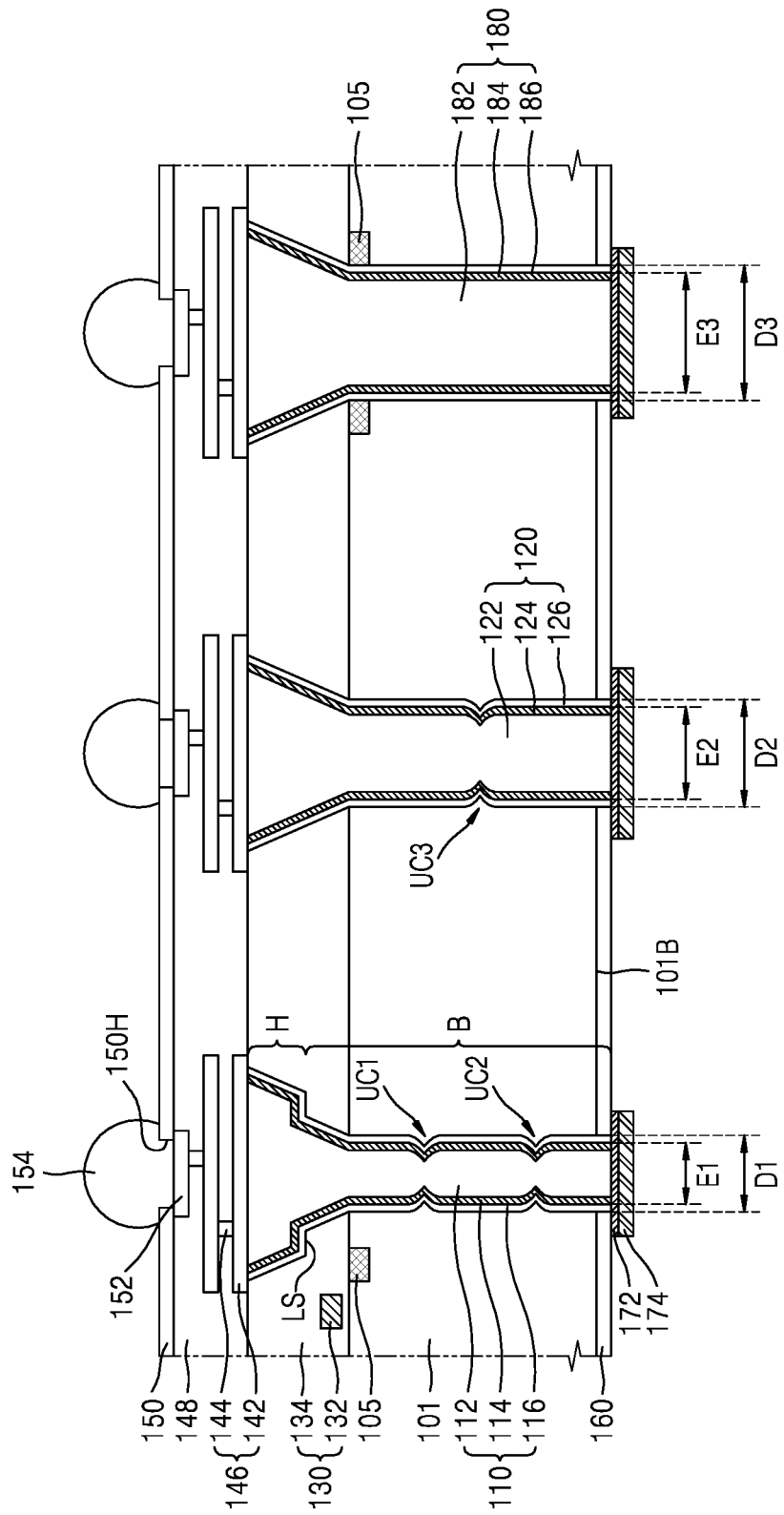
FIG. 8 is a side cross-sectional view illustrating a semiconductor device according to an exemplary embodiment of the present disclosure.

FIG. 8 is a side cross-sectional view of a semiconductor device according to an exemplary embodiment of the present disclosure. The embodiment shown in FIG. 8 may be substantially the same as the embodiment shown in FIG. 3 except that the semiconductor device further includes a third via structure 180 having a third diameter D3 greater than a second diameter D2. Accordingly, differences between the embodiments shown in FIGS. 3 and 8 will mainly be described in detail and it may be assumed that those elements not disclosed herein are at least similar to corresponding elements that are described in detail elsewhere within the instant application.

Referring to FIG. 8, the third via structure 180 may have the third diameter D3 and include a third via plug 182, a third barrier film 184 formed on a surface of the third via plug 182 to a substantially uniform thickness, and a third via insulating film 186 formed on a surface of the third barrier film 184 to a substantially uniform thickness.

Since the third via plug 182, the third barrier film 184, and the third via insulating film 186 are substantially the same as the first via plug 112, the first barrier film 114, and the first via insulating film 116, respectively, except for dimensions thereof, detailed descriptions thereof will be omitted here.

The third via structure 180 may have the third diameter D3, which may be greater than the second diameter D2 of a second via structure 120. In some exemplary embodiments of the present disclosure, the third diameter D3 may be greater than the second diameter D2 by about 1 μm to about 5 μm. The third diameter D3 may be an outer diameter of the third via insulating film 186.

The third barrier film 184 of the third via structure 180 may have a third barrier width E3, which may be greater than a second barrier width E2 of the second via structure 120. The third barrier width E3 may be greater than the second barrier width E2 by about 1 μm to about 4 μm.

In this case, the second via structure 120 may include at least one undercut portion (e.g. UC3). Also, the first via structure 110 may include at least two undercut portions (e.g., UC1 and UC2). The first via structure 110 may include a larger number of undercut portions than the second via structure 120. In some exemplary embodiments of the present disclosure, the first via structure 110 may include two undercut portions UC1 and UC2, and the second via structure 120 may include one undercut portion UC3.

In some exemplary embodiments of the present disclosure, a level of the undercut portion UC3 of the second via structure 120 may be between the two undercut portions UC1 and UC2 of the first via structure 110. For example, based on a lower surface 101B of the semiconductor substrate 101, a level of the undercut portion UC2 of the first via structure 110 may be lowest, a level of the undercut portion UC1 of the first via structure 110 may be highest, and the level of the undercut portion UC3 of the second via structure 120 may be between the levels of the undercut portions UC1 and UC2 of the first via structure 110.

In addition, a device isolation film 105 may be provided around the third via structure 180. The device isolation film 105 may be in contact with a side surface of the third via structure 180 and may at least partially surround the third via structure 180 in a lateral direction over a partial height of the third via structure 180.

Figure 9:
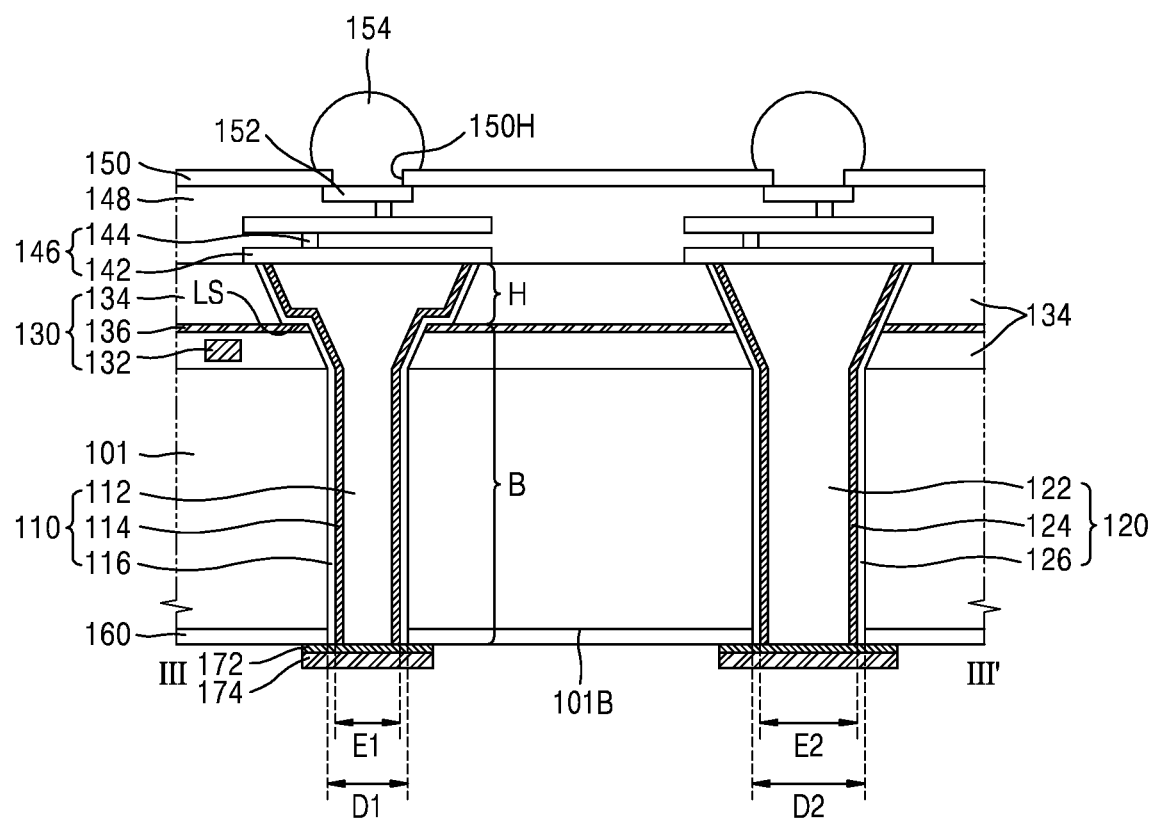
FIG. 9 is a side cross-sectional view taken along a line III-III' of FIG. 2, in a semiconductor device according to an exemplary embodiment of the present disclosure.

FIG. 9 is a side cross-sectional view taken along a line III-III' of FIG. 2, in a semiconductor device according to an exemplary embodiment of the present disclosure. The embodiment shown in FIG. 9 may be substantially the same as the embodiment shown in FIG. 3 except that the semiconductor device further includes an etch stop film 136 provided in an interlayer insulating film 134. Accordingly, differences between the embodiments shown in FIGS. 3 and 9 will mainly be described in detail and it may be assumed that those elements not disclosed herein are at least similar to corresponding elements that are described in detail elsewhere within the instant application.

Referring to FIG. 9, the etch stop film 136 may be provided in the interlayer insulating film 134. The etch stop film 136 may extend in a direction parallel to an upper surface of the semiconductor substrate 101 between a top surface and a bottom surface of the interlayer insulating film 134. In some exemplary embodiments of the present disclosure, an upper surface of the etch stop film 136 may be in contact with a lower surface LS of a head portion H of the first via structure 110.

In some exemplary embodiments of the present disclosure, the semiconductor element 132 may be provided between the upper surface of the semiconductor substrate 101 and the etch stop film 136.

The etch stop film 136 may include an arbitrary material having an etch selectivity with respect to the interlayer insulating film 134. The etch stop film 136 may include a TEOS film, an HDP film, a BPSG film, an FCVD oxide film, a SiN film, a SiON film, or an ultralow K (ULK) film having an ultralow dielectric constant K of about 2.2 to about 2.4.

Although a thickness of the etch stop film 136 is not specifically limited, the thickness of the etch stop film 136 may range from, for example, about 0.1 μm to about 50 μm. The etch stop film 136 may be formed using a CVD process, an ALD process, or a PVD process, but is not limited thereto.

Figure 10:
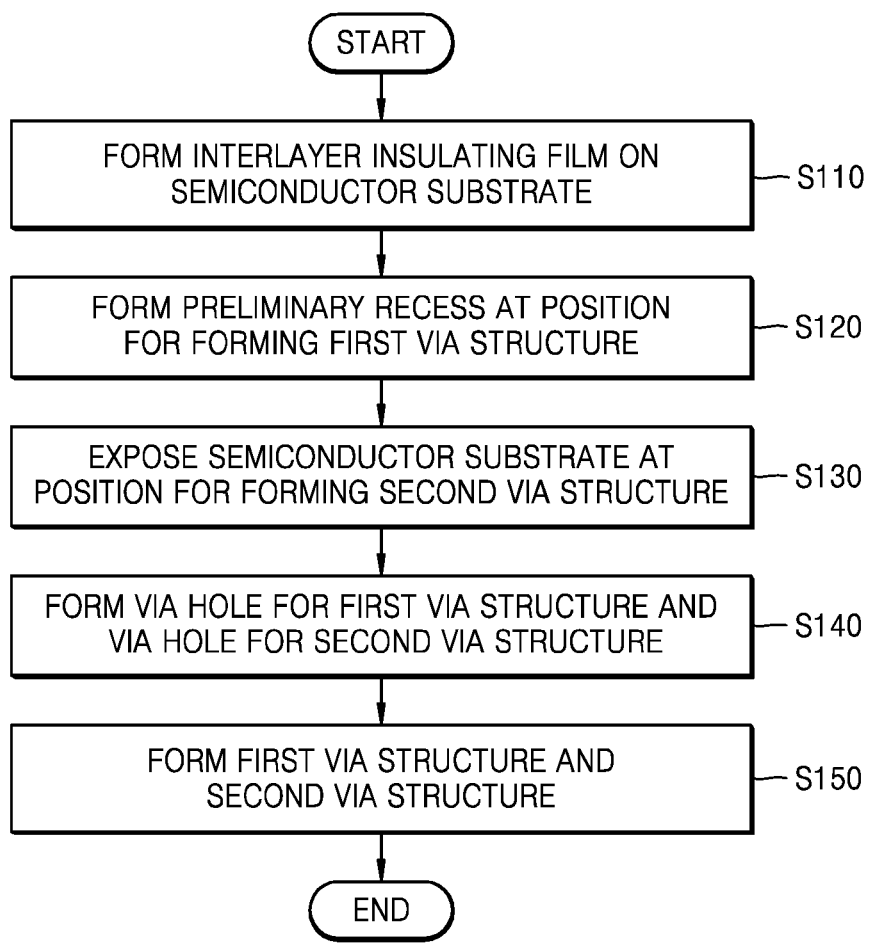
FIG. 10 is a flowchart illustrating a method of manufacturing a semiconductor device according to an exemplary embodiment of the present disclosure.

FIG. 10 is a flowchart of a method of manufacturing a semiconductor device according to an exemplary embodiment of the present disclosure. FIGS. 11A to 11K are side cross-sectional views of the method of manufacturing the semiconductor device according to the embodiment shown in FIG. 10.

Figure 11A:
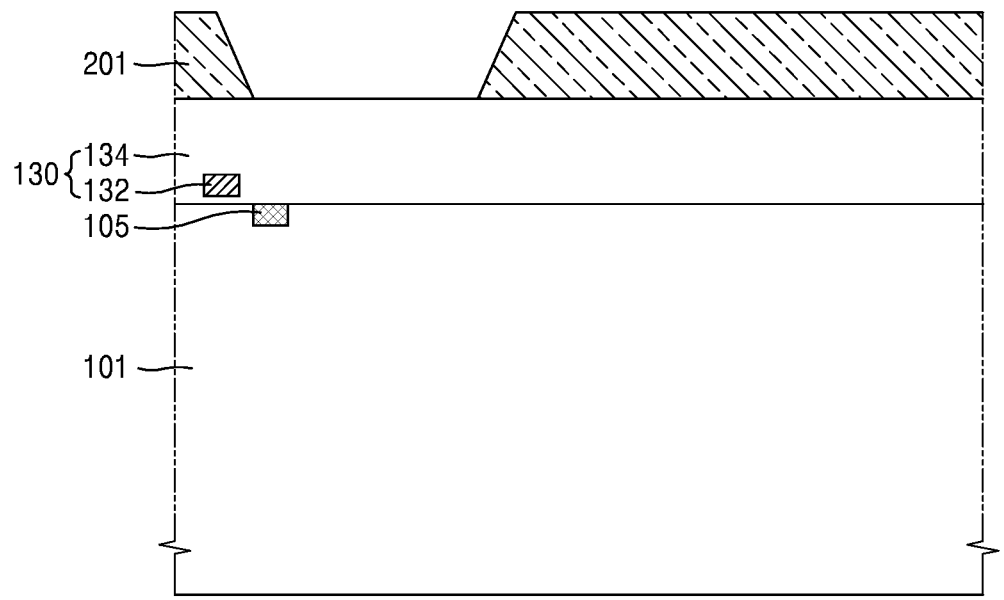
FIGS. 11A to 11K are side cross-sectional views illustrating a method of manufacturing a semiconductor device according to an exemplary embodiment of the present disclosure.

Referring to FIGS. 10 and 11A, an interlayer insulating film 134 may be formed on a semiconductor substrate 101

(S110). In some exemplary embodiments of the present disclosure, before the interlayer insulating film 134 is formed, a semiconductor element 132 may be formed on the semiconductor substrate 101. The semiconductor element 132 and the interlayer insulating film 134, which are formed prior to the formation of a multi-layered interconnection structure, may be collectively referred to as a front-end-of-line (FEOL) structure 130.

Thereafter, a first mask pattern 201 may be formed on the interlayer insulating film 134. The first mask pattern 201 may be a photoresist pattern. The formation of the first mask pattern 201 may include coating a photoresist material film and performing an exposure process and a development process.

The first mask pattern 201 may be configured to expose the interlayer insulating film 134 at a position (hereinafter, referred to as a 'first position') for forming a first via structure.

Figure 12:
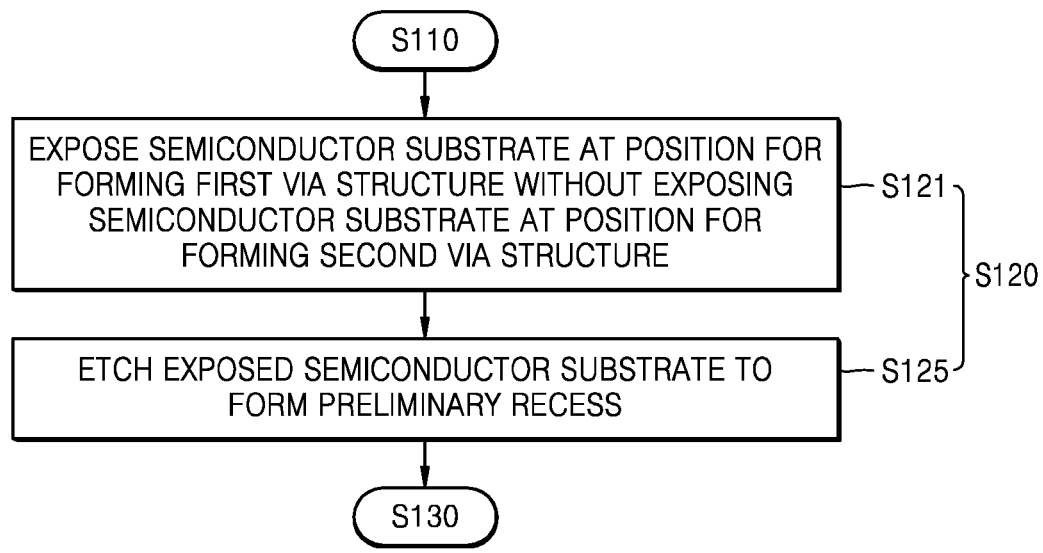
FIG. 12 is a detailed flowchart illustrating an operation of forming a preliminary recess shown in FIG. 10.

Referring to FIG. 10, a preliminary recess having a first depth may be formed at the first position (S120). FIG. 12 is a detailed flowchart of an operation of forming the preliminary recess of FIG. 10. Referring to FIG. 12, to form the preliminary recess, initially, the semiconductor substrate 101 at the first position may be exposed without exposing the semiconductor substrate 101 at a position (hereinafter, referred to as a 'second position') for forming a second via structure (S121). Thereafter, the semiconductor substrate 101 exposed at the first position may be etched to form the preliminary recess (S125).

Figure 13:
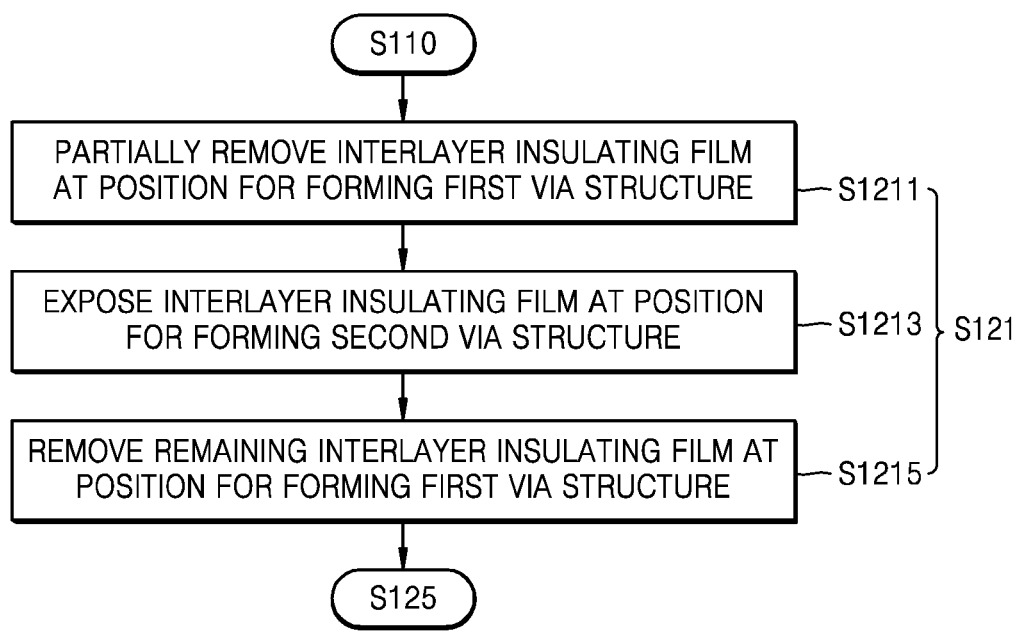
FIG. 13 is a detailed flowchart illustrating an operation of exposing a semiconductor substrate at a first position of FIG. 12.

FIG. 13 is a detailed flowchart illustrating an operation of exposing a semiconductor substrate at the first position of FIG. 12. Referring to FIG. 13, initially, the interlayer insulating film 134 may be partially removed at the first position (S1211). Thereafter, the interlayer insulating film 134 may be exposed at the second position (S1213). Subsequently, the interlayer insulating film 134, which remains, may be removed at the first position, thereby exposing the semiconductor substrate 101 at the first position (S1215).

FIGS. 11B to 11F are side cross-sectional views illustrating process operations until the preliminary recess is formed.

Figure 11B:
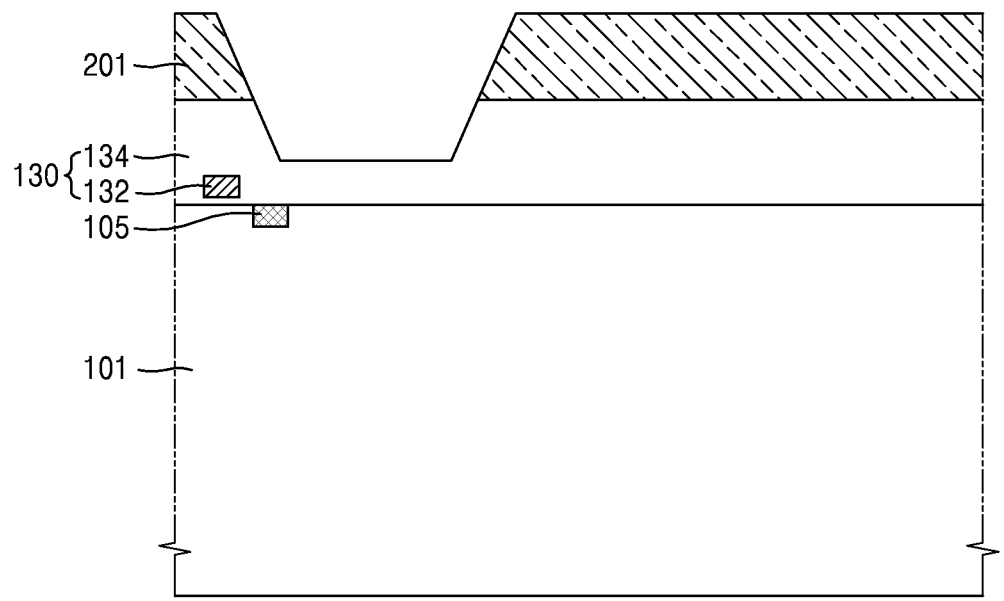

Referring to FIGS. 11B, 12, and 13, a portion of the interlayer insulating film 134 at the first position may be removed using the first mask pattern 201 as an etch mask. The portion of the interlayer insulating film 134 may be removed using an anisotropic etching process. In some exemplary embodiments of the present disclosure, a timing etching process may be performed to remove the portion of the interlayer insulating film 134 at the first position. In some exemplary embodiments of the present disclosure, to remove the portion of the interlayer insulating film 134 at the first position, an etch stop film 136 may be previously provided in the interlayer insulating film 134 as shown in FIG. 9.

The portion of the interlayer insulating film 134, which is partially removed using the first mask pattern 201 as an etch mask, may have a planar form, for example, in the form of circles, polygons, and ellipses. However, the inventive concept is not limited thereto.

Figure 11C:
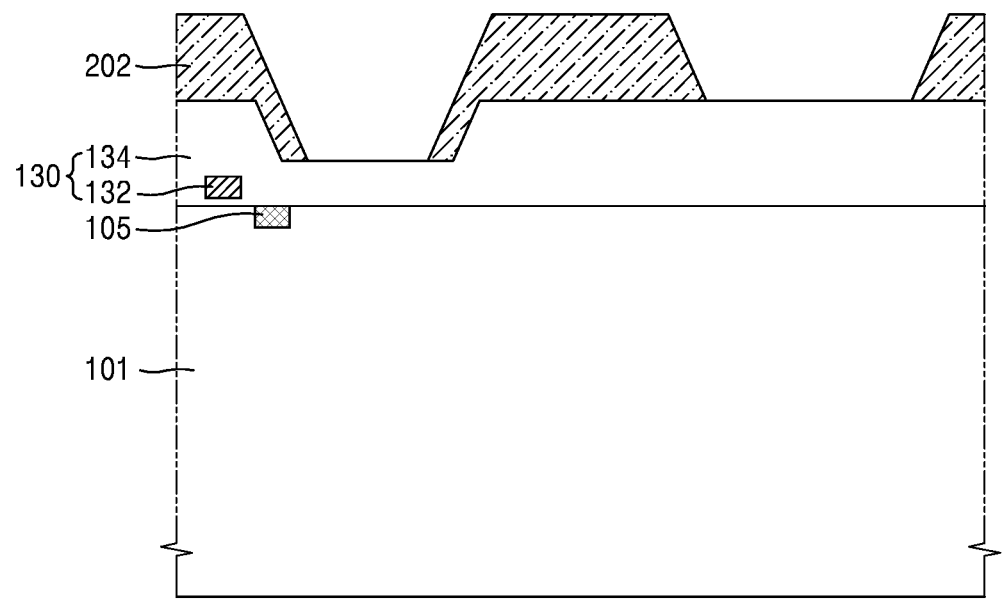

Referring to FIGS. 11C, 12, and 13, the first mask pattern 201 may be removed and then, a second mask pattern 202 may be formed. The first mask pattern 201 may be removed by a dissolution process using a solvent or an ashing process performed in an oxidation atmosphere. Subsequently, a new photoresist material film may be formed and patterned using an exposure process and a development process, thereby forming the second mask pattern 202.

The second mask pattern 202 may expose the interlayer insulating film 134 at the second position. Also, the second mask pattern 202 may expose the interlayer insulating film 134 at the first position. In this case, the second mask pattern 202 may have an opening having a smaller width than an opening of the first mask pattern 201. As shown in FIG. 11C, the second mask pattern 202 may be in contact with a sidewall of a recess of the interlayer insulating film 134, which is formed by partially removing the interlayer insulating film 134 at the first position. Furthermore, the second mask pattern 202 may be in contact with a portion of a bottom surface of the recess of the interlayer insulating film 134, which is formed by partially removing the interlayer insulating film 134 at the first position.

Figure 11D:
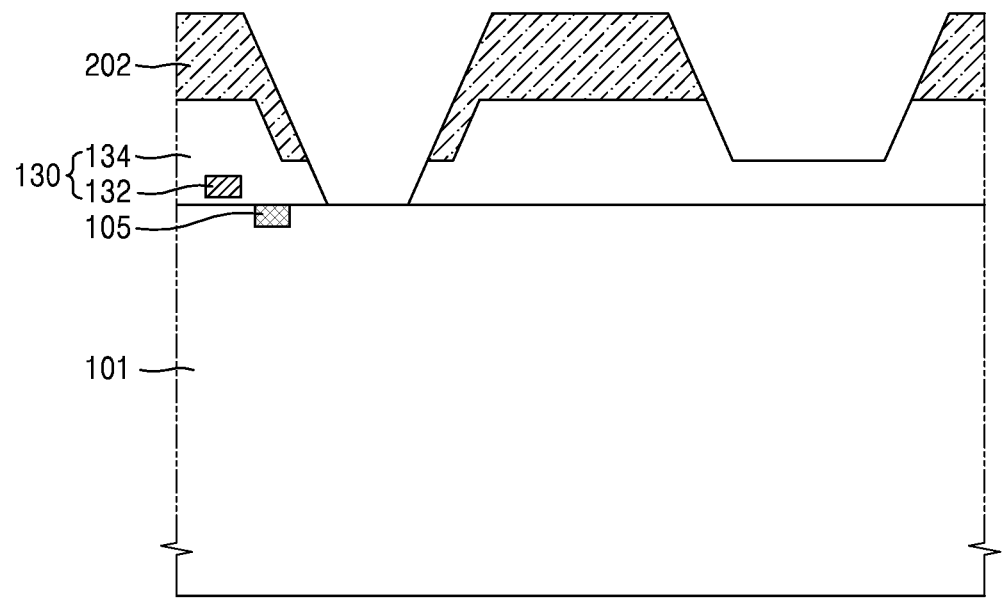

Referring to FIGS. 11D, 12, and 13, the interlayer insulating film 134, which remains, may be removed at the first position, thereby exposing an upper surface of the semiconductor substrate 101 at the first position. In this case, the interlayer insulating film 134 may be partially removed at the second position.

The removal of the interlayer insulating film 134, which remains, at the first position may be performed using an anisotropic etching process.

In FIGS. 11A to 11D, side surfaces of each pattern are shown as inclined surfaces rather than vertical surfaces, but the inventive concept is not limited thereto. The side surfaces of each pattern may be the vertical surfaces rather than the inclined surfaces depending on actual manufacturing conditions.

Figure 11E:
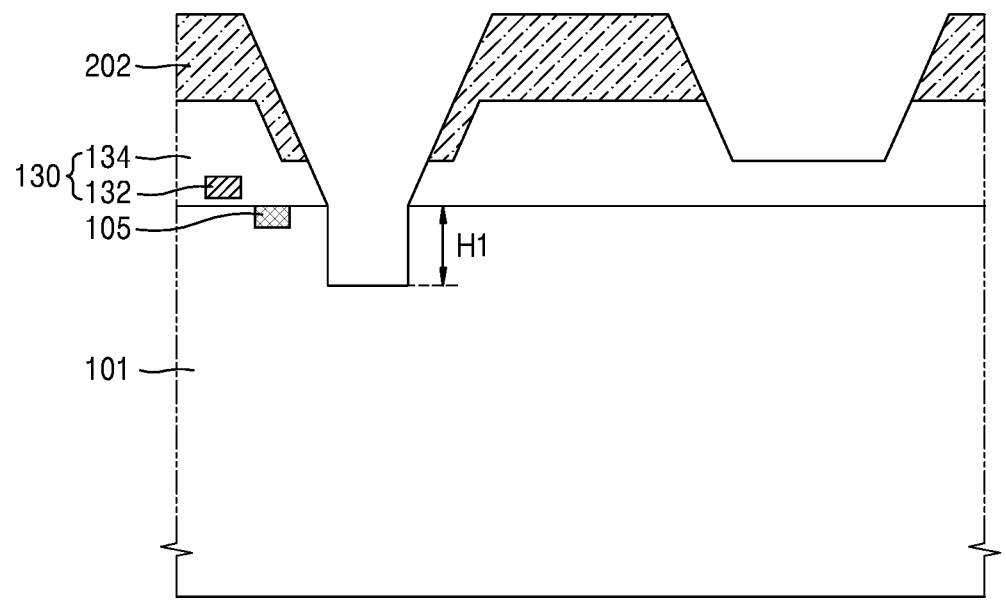

Referring to FIGS. 11E, 12, and 13, the semiconductor substrate 101, which is exposed, may be etched to form a preliminary recess having a depth of H1. In this case, since the semiconductor substrate 101 at the first position has an etch selectivity with respect to the interlayer insulating film 134 at the second position, while the preliminary recess is being formed by etching the semiconductor substrate 101 at the first position, the interlayer insulating film 134 at the second position might not be etched or may only be slightly etched, as compared to other etching of the semiconductor substrate 101.

In some exemplary embodiments of the present disclosure, the formation of the preliminary recess at the first position may be performed using a DRIE process.

Figure 11F:
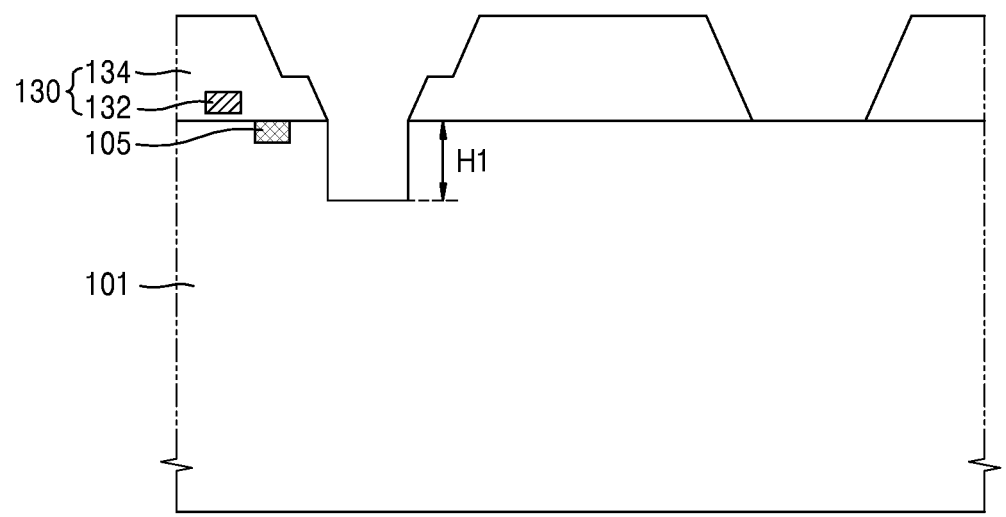

Referring to FIGS. 10 and 11F, the upper surface of the semiconductor substrate 101 may be exposed at the second position (S130). An anisotropic etching process may be performed to expose the upper surface of the semiconductor substrate 101 at the second position.

Since the semiconductor substrate 101 at the first position has an etch selectivity with respect to the interlayer insulating film 134 at the second position as described with reference to FIG. 11E, the preliminary recess at the first position might not be etched or may only be slightly etched during the etching and removal of the interlayer insulating film 134 at the second position.

Figure 11G:
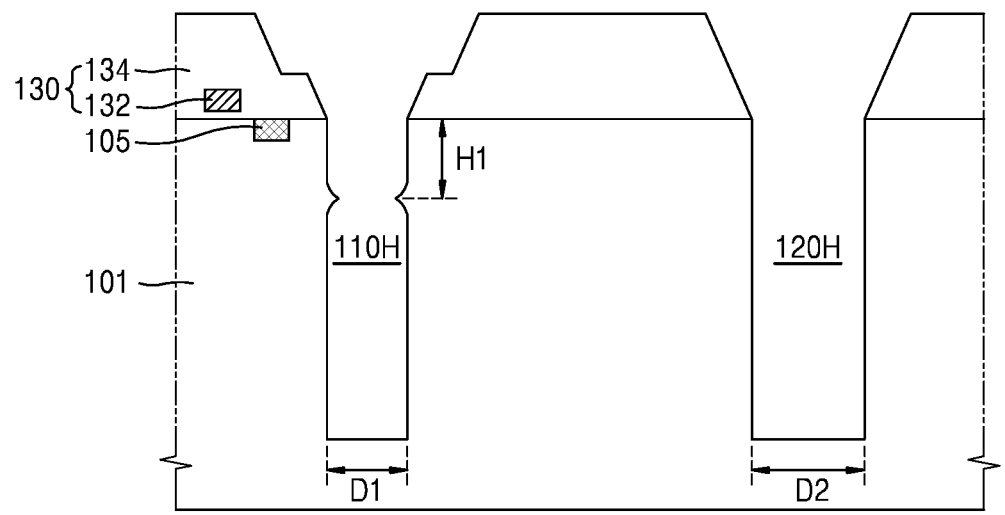

Referring to FIGS. 10 and 11G, the preliminary recess and the semiconductor substrate 101 at the second position may be simultaneously etched, thereby forming both a via hole (referred to as a first via hole) 110H for a first via structure and a via hole (referred to as a second via hole) 120H for a second via structure (S140). The first via hole 110H and the second via hole 120H may each have a second depth that is greater than the first depth (S140).

The above-described DRIE process may be performed to form the first via hole 110H and the second via hole 120H. The first via hole 110H may have a first diameter D1, and the second via hole 120H may have a second diameter D2. The second diameter D2 may be greater than the first diameter D1. Since the second diameter D2 is greater than the first diameter D1, an etch rate may be higher for the second via hole 120H than for the first via hole 110H. Although an etch rate of the semiconductor substrate 101 is lower at the first via hole 110H than at the second via hole 120H, since the preliminary recess is previously formed, the first via hole 110H may have the same depth as the second via hole 120H at an etch stop point in time.

In addition, after the preliminary recess is formed using the DRIE process at the first via hole 101H (refer to FIG. 11E), when the semiconductor substrate 101 is etched using the DRIE process to form the remaining portion of the first via hole 101H, an undercut portion may be formed at an interface between portions that are respectively etched due to the two DRIE processes. For example, a level of the undercut portion of the first via hole 101H may correspond to a level of a bottom surface of the preliminary recess.

Figure 11H:
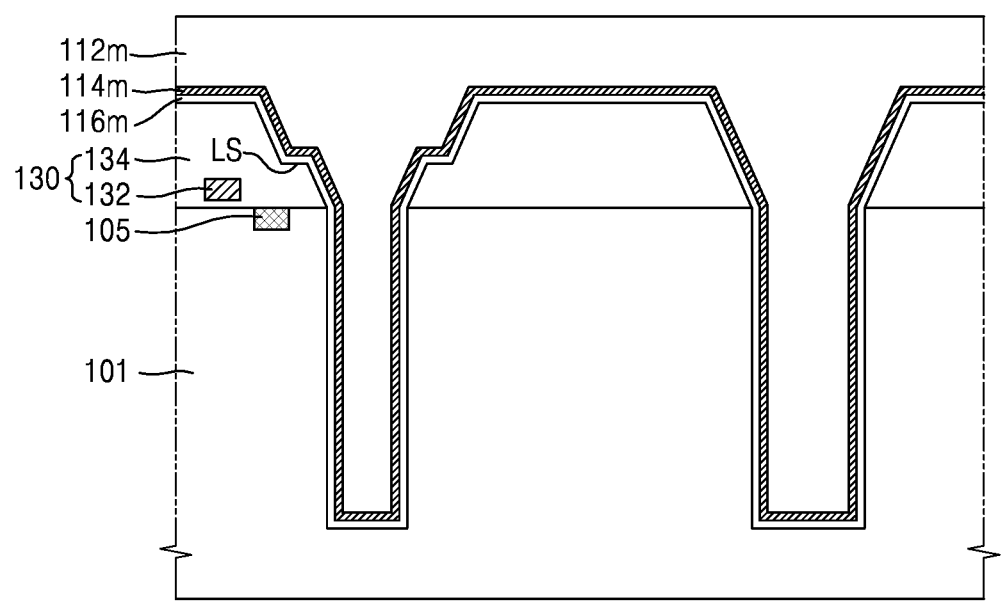

Referring to FIGS. 10 and 11H, a via insulating material film 116m and a barrier material film 114m may be sequentially formed on sidewalls and bottom surfaces of the first via hole 110H and the second via hole 120H and an exposed surface of the interlayer insulating film 134.

The via insulating material film 116m and the barrier material film 114m may each be formed using a PVD process, a CVD process, or an ALD process. The materials for the via insulating material film 116m and the barrier material film 114m are described above with reference to FIG. 3.

A plug material film 112m configured to fill the remaining space may be formed on the barrier material film 114m. The plug material film 112m may be formed using, for example, an electroplating process. For example, a metal seed layer may be formed on a surface of the barrier material film 114m, a metal film may be grown from the metal seed layer due to an electroplating process, and the plug material film 112m configured to fill the remaining space may be formed on the barrier material film 114m. The metal seed layer may include copper (Cu), a Cu alloy, cobalt (Co), nickel (Ni), ruthenium (Ru), cobalt/copper (Co/Cu), or ruthenium/copper (Ru/Cu). The metal seed layer may be formed using a PVD process. A main material for the plug material film 112m may include Cu or W. In some exemplary embodiments of the present disclosure, the plug material film 112m may include copper (Cu), copper tin (CuSn), copper magnesium (CuMg), copper nickel (CuNi), copper zinc (CuZn), copper palladium (CuPd), copper gold (CuAu), copper tungsten (CuW), tungsten (W), or a W alloy, but is not limited thereto. The electroplating process may be performed at a temperature of about 10° C. to about 65° C. For example, the electroplating process may be performed at room temperature. After the plug material film 112m is formed, when necessary, the resultant structure including the plug material film 112m may be annealed at a temperature of about 150° C. to about 450° C.

Figure 11I:
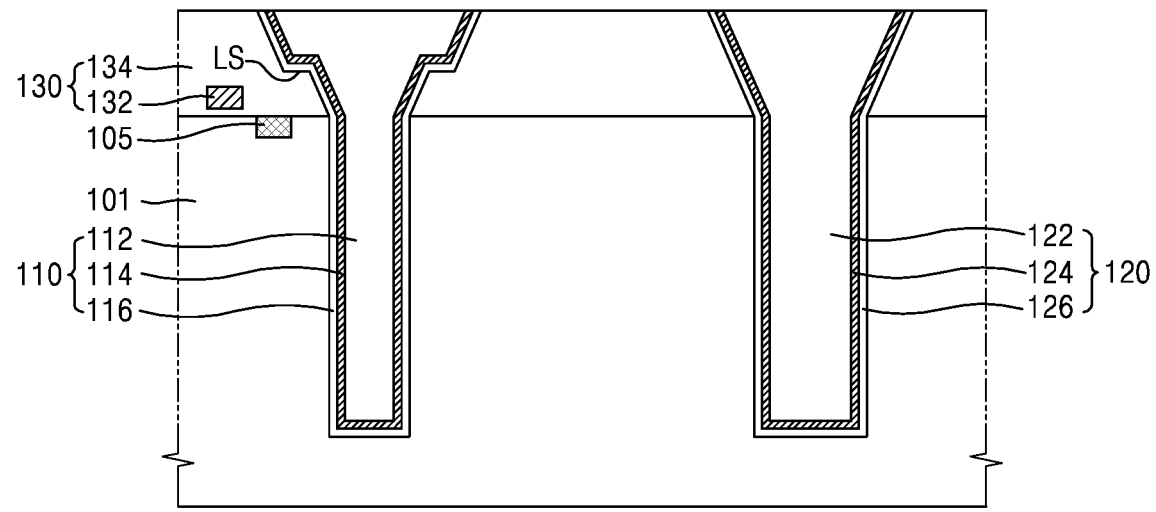

Referring to FIGS. 10 and 11I, the plug material film 112m, the barrier material film 114m, and the via insulating material film 116m may each be partially removed to form a first via structure 110 and a second via structure 120 (S150).

The partial removal of the plug material film 112m, the barrier material film 114m, and the via insulating material film 116m may be performed using, for example, a chemical mechanical polishing (CMP) process or an etchback process.

Figure 11J:
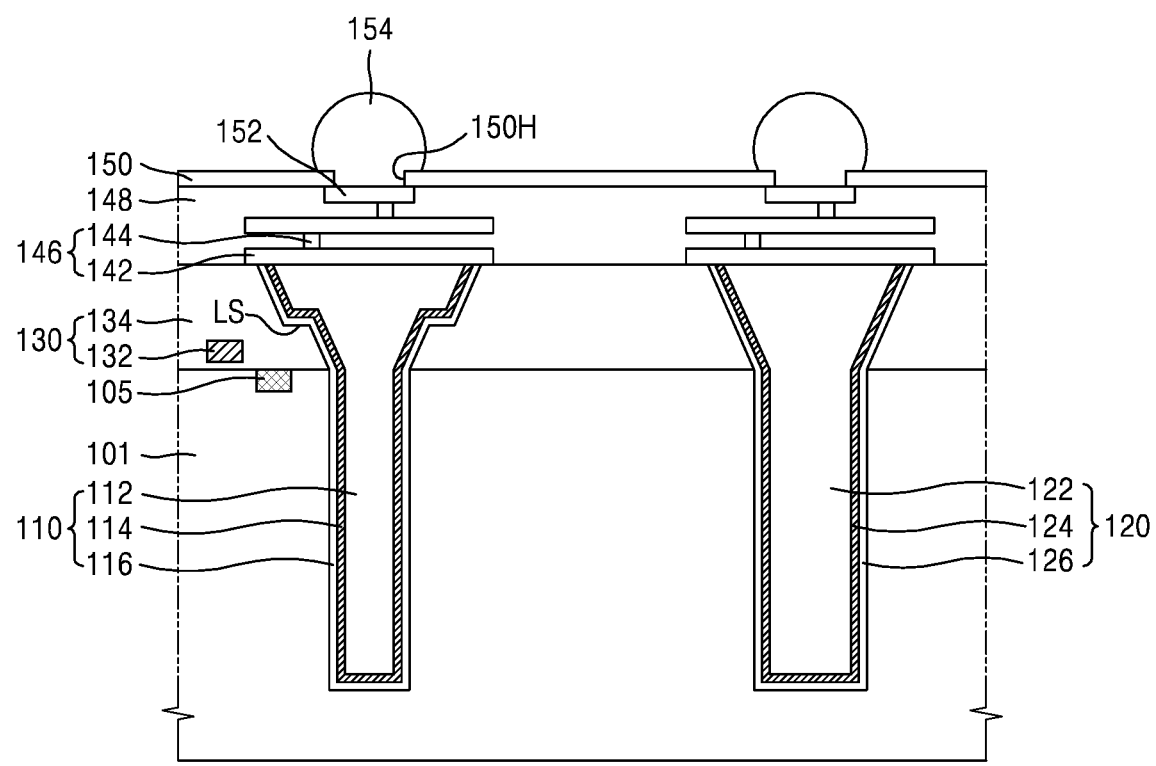

Referring to FIGS. 10 and 11J, a plurality of metal interconnection layers 142, a plurality of contact plugs 144, and a bonding pad 152, which are electrically connected to a first via plug 112, may be formed at the first position. Also, a plurality of metal interconnection layers 142, a plurality of contact plugs 144, and a bonding pad 152, which are electrically connected to a second via plug 122, may be formed at the second position.

Thereafter, an upper insulating film 150 may be formed to expose at least portions of the bonding pads 152, and upper connection terminals 154 may be formed on the bonding pads 152.

Figure 11K:
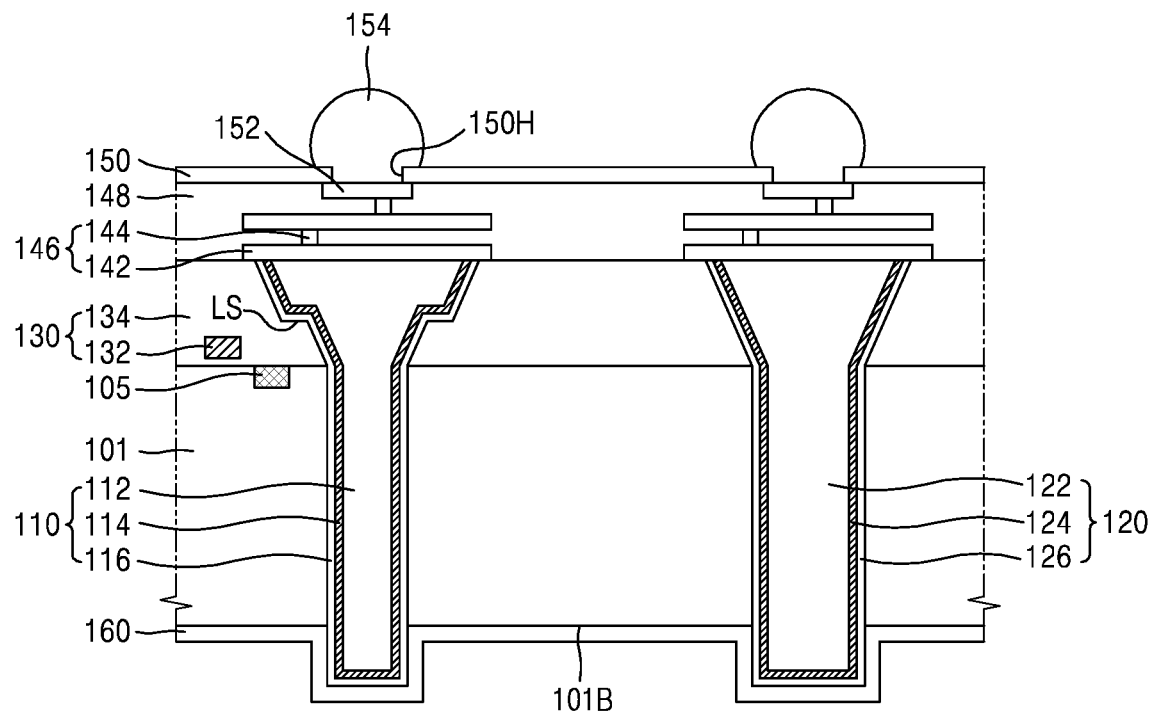

Referring to FIGS. 10 and 11K, the semiconductor substrate 101 may be partially removed such that end portions of the first via structure 110 and the second via structure 120 may pass through a lower surface 101B of the semiconductor substrate 101 and be exposed.

In some exemplary embodiments of the present disclosure, the partial removal of the semiconductor substrate 101 may be performed using, for example, a CMP process.

Furthermore, a lower insulating film 160 may be formed to cover the lower surface 101B of the semiconductor substrate 101. The lower insulating film 160 may be formed to cover a first via insulating film 116 and a second via insulating film 126, which protrude from the lower surface 101B of the semiconductor substrate 101. In some exemplary embodiments of the present disclosure, the lower insulating film 160 may be formed using a CVD process. In some exemplary embodiments of the present disclosure, the lower insulating film 160 may include a silicon oxide film, a silicon nitride film, or a polymer.

Thereafter, referring to FIG. 3, a polishing process may be performed on an exposed surface of the lower insulating film 160 until a planarized surface is obtained at the lower surface 101B of the semiconductor substrate 101. Planarized bottom surfaces of the first and second via structure 110, 120 may be exposed at the lower surface 101B of the semiconductor substrate 101.

Thereafter, a conductive layer 172 and coupling terminals 174 may be formed and connected to the first and second via structures 110 and 120.

The conductive layer 172 may form an under bump metallization (UBM) film and include films having various compositions according to materials included in the coupling terminals 174. In some exemplary embodiments of the present disclosure, the conductive layer 172 may include titanium (Ti), copper (Cu), nickel (Ni), gold (Au), nickel vanadium (NiV), nickel phosphide (NiP), titanium nickel (TiNi), titanium tungsten (TiW), tantalum nitride (TaN), aluminum (Al), palladium (Pd), chromium copper (CrCu), or a combination thereof. For example, the conductive layer 172 may have a Cr/Cu/Au stack structure, a Cr/CrCu/Cu stack structure, a TiWCu compound, a TiWCu/Cu stack structure, a Ni/Cu stack structure, a NiV/Cu stack structure, a Ti/Ni stack structure, a Ti/NiP stack structure, a TiWNiV compound, an Al/Ni/Au stack structure, an Al/NiP/Au stack structure, a stack structure of a Ti/TiNi/CuNi compound, a Ti/Ni/Pd stack structure, an Ni/Pd/Au stack structure, or a NiP/Pd/Au stack structure.

The coupling terminals 174 may include conductive pads, solder balls, solder bumps, or a redistribution conductive layer. The coupling terminals 174 may be connected to bottom surfaces of the first and second via structures 110 and 120 through the conductive layer 172. The coupling terminals 174 may include nickel (Ni), copper (Cu), aluminum (Al), or a combination thereof, but are not limited thereto.

Figure 14:
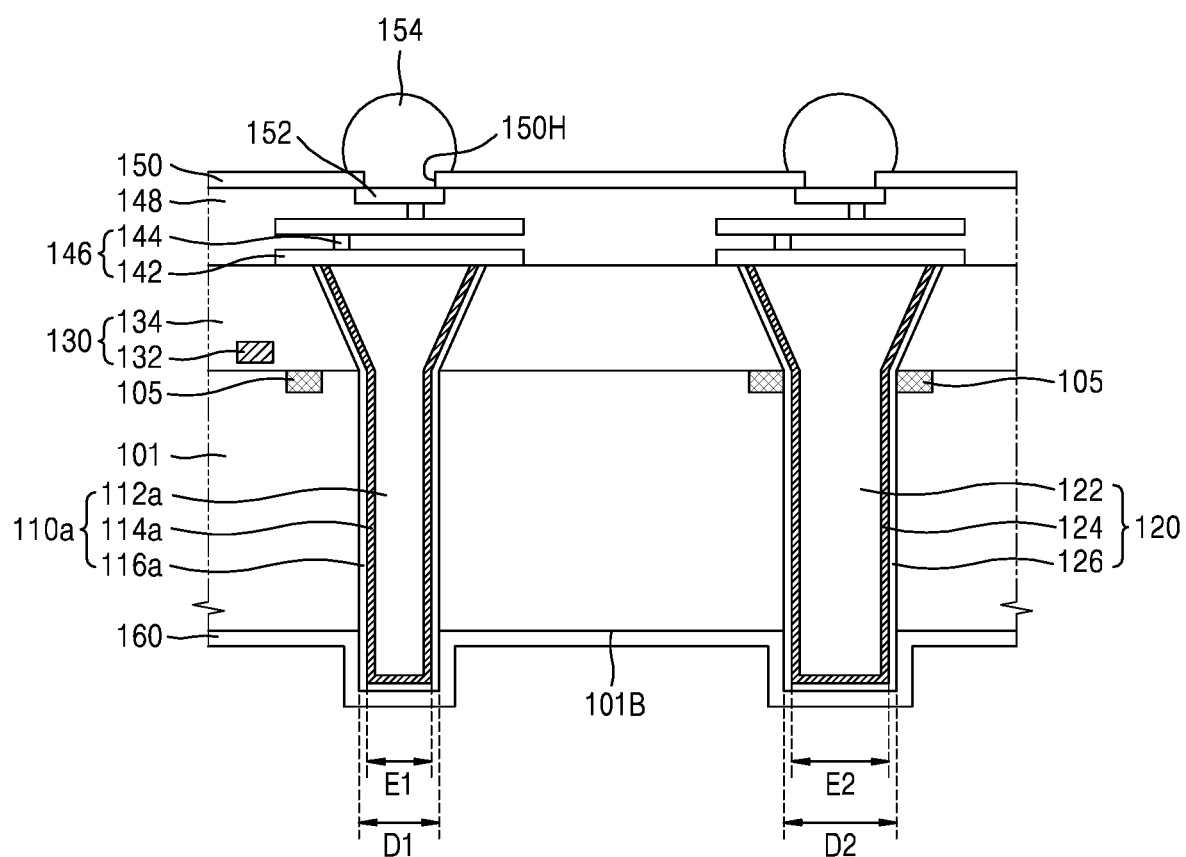
FIG. 14 is a side cross-sectional view taken along a line III-III' of FIG. 2, in a semiconductor device according to an exemplary embodiment of the present disclosure.

FIG. 14 is a side cross-section view taken along a line III-III' of FIG. 2, in a semiconductor device according to an exemplary embodiment of the present disclosure. The embodiment shown in FIG. 14 may be substantially the same as the embodiment shown in FIG. 3 except that a first via structure 110a does not include a head portion. Accordingly, differences between the embodiments shown in FIGS. 3 and 14 will mainly be described in detail and it is to be assumed that those elements not described with respect to FIG. 14 may be at least similar to corresponding elements that have already been described with respect to FIG. 3.

The first via structure 110a may have a first diameter D1, which is less than a second diameter D2. The first via structure 110a may have this first diameter D1 through an entire depth of the semiconductor substrate. In addition, a diameter of the first via structure 110a in a lateral direction may be increased in a direction away from the semiconductor substrate 101 in the interlayer insulating film 134 such that the first via structure 110a has a cone shape within the interlayer insulating film 134.

The first via structure 110a may include a first via plug 112a, a first barrier film 114a formed to a substantially constant thickness on a surface of the first via plug 112a, and a first via insulating film 116a formed to a substantially constant thickness on a surface of the first barrier film 114a.

FIGS. 15A to 15F are side views of a process sequence of a method of manufacturing the semiconductor device of FIG. 14.

Figure 15A:
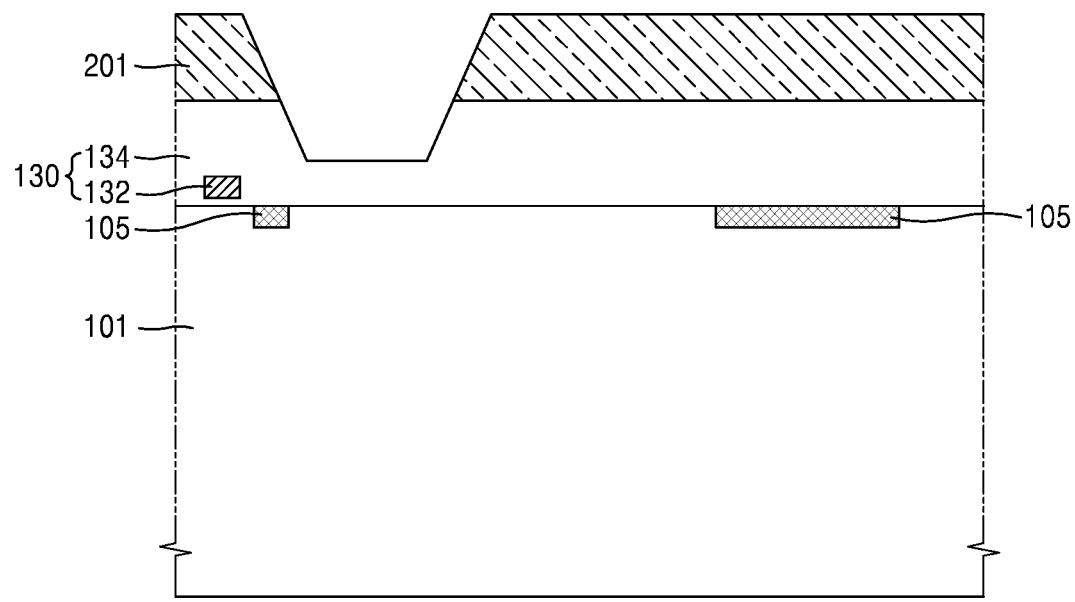
FIGS. 15A to 15F are side views illustrating a process sequence of a method of manufacturing the semiconductor device of FIG. 14.

Referring to FIG. 15A, a first mask pattern 201 may be formed to expose an interlayer insulating film at a first position. Since the first mask pattern 201 is the same as described with reference to FIG. 11A, a detailed description thereof will be omitted here, and it is to be assumed that to the extent that elements are not described herein with respect to FIG. 15A, these elements may be at least similar to corresponding elements that have been described with respect to FIG. 11A.

Figure 15B:
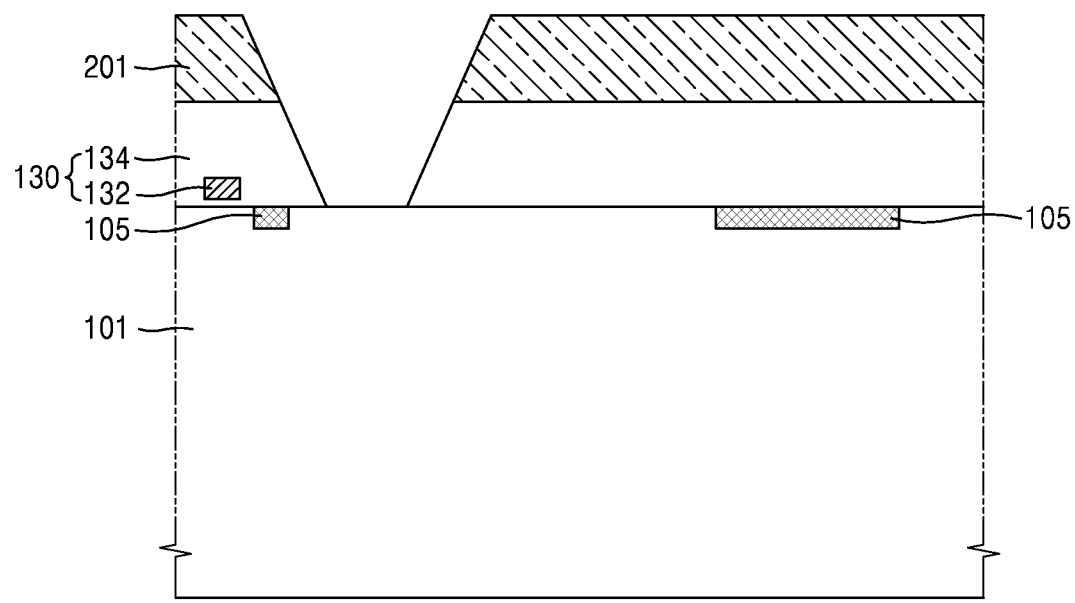

By using the first mask pattern 201 as an etch mask, the interlayer insulating film 134 may be partially removed over a partial thickness thereof. In an exemplary embodiment of the present disclosure, as shown in FIG. 15B, the interlayer insulating film 134 may be completely removed over the entire thickness thereof using the first mask pattern 201 as an etch mask.

In some exemplary embodiments of the present disclosure, a device isolation film 105 may be provided at a second position of the semiconductor substrate 101. The device isolation film 105 at the second position may be formed during the defining of active regions for forming semiconductor elements 132. Therefore, an additional process for forming the device isolation film 105 at the second position might not be needed.

Figure 15C:
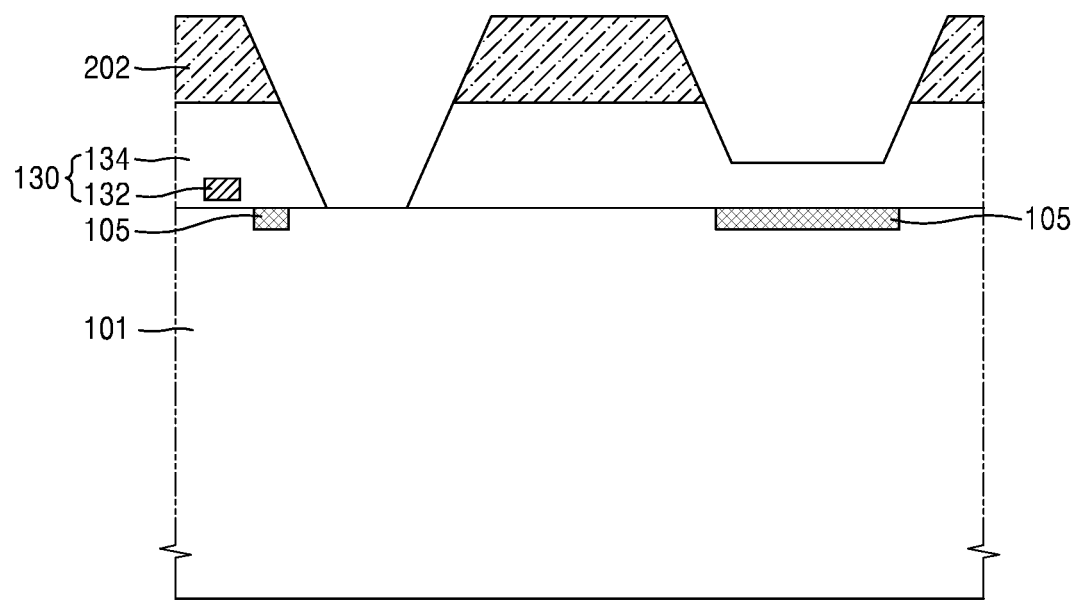

Referring to FIG. 15C, after the first mask pattern 201 is removed, a second mask pattern 202 may be formed. The first mask pattern 201 may be removed by a dissolution process using a solvent or an ashing process performed in an oxidation atmosphere. Subsequently, a new photoresist material film may be formed and patterned using an exposure process and a development process, thereby forming the second mask pattern 202.

The second mask pattern 202 may expose the interlayer insulating film 134 at the second position. Also, the second mask pattern 202 may have an opening, which exposes the interlayer insulating film 134 at the first position and the second mask pattern 202 has the same width as an opening of the first mask pattern 201.

Thereafter, a portion of the interlayer insulating film 134 at the second position may be removed using second mask pattern 202 as an etch mask. When the interlayer insulating film 134 at the first position is only partially removed as shown in FIG. 15A, while the interlayer insulating film 134 at the second position is being partially removed, the interlayer insulating film 134 at the first position may be completely removed over the entire thickness thereof.

In addition, when the interlayer insulating film 134 at the first position is completely removed, as shown in FIG. 15B, since the semiconductor substrate 101 at the first position has an etch selectivity with respect to the interlayer insulating film 134 at the second position, while the interlayer insulating film 134 is being etched at the second position, the semiconductor substrate 101 at the first position might not be etched or may only be etched to a small extent.

Figure 15D:
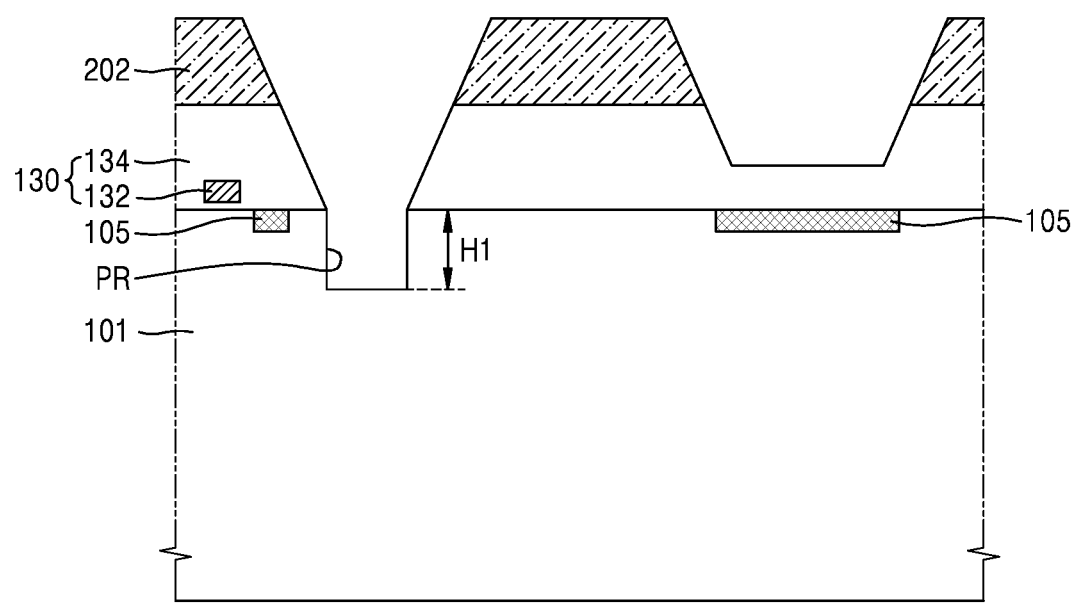

Referring to FIG. 15D, the semiconductor substrate 101, which is exposed, may be etched to form a preliminary recess PR having a first depth of H1. In this case, since the semiconductor substrate 101 at the first position has an etch selectivity with respect to the interlayer insulating film 134 at the second position, while the preliminary recess PR is being formed by etching the semiconductor substrate 101 at the first position, the interlayer insulating film 134 at the second position might not be etched or may only be slightly etched.

In some exemplary embodiments of the present disclosure, a DRIE process may be performed to form the preliminary recess PR at the first position.

Figure 15E:
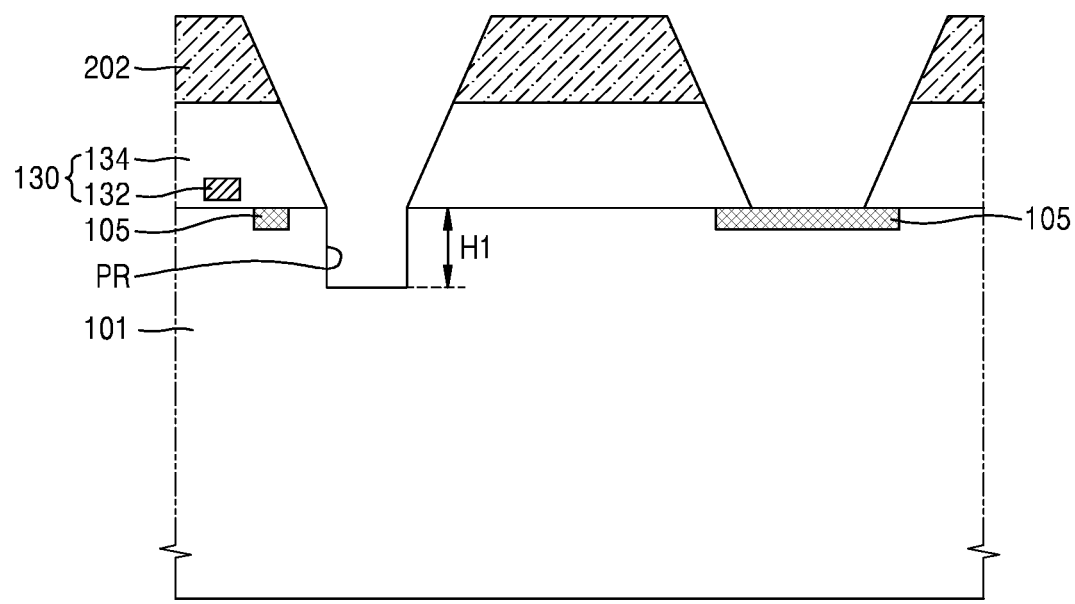

Referring to FIG. 15E, an upper surface of the semiconductor substrate 101 at the second position may be exposed. An anisotropic etching process may be performed to expose the upper surface of the semiconductor substrate 101 at the second position.

Since the semiconductor substrate 101 at the first position has an etch selectivity with respect to the interlayer insulating film 134 at the second position as described above with reference to FIG. 15D, while the interlayer insulating film 134 at the second position is being etched and removed, the preliminary recess PR at the first position might not be etched or may only be slightly etched.

Figure 15F:
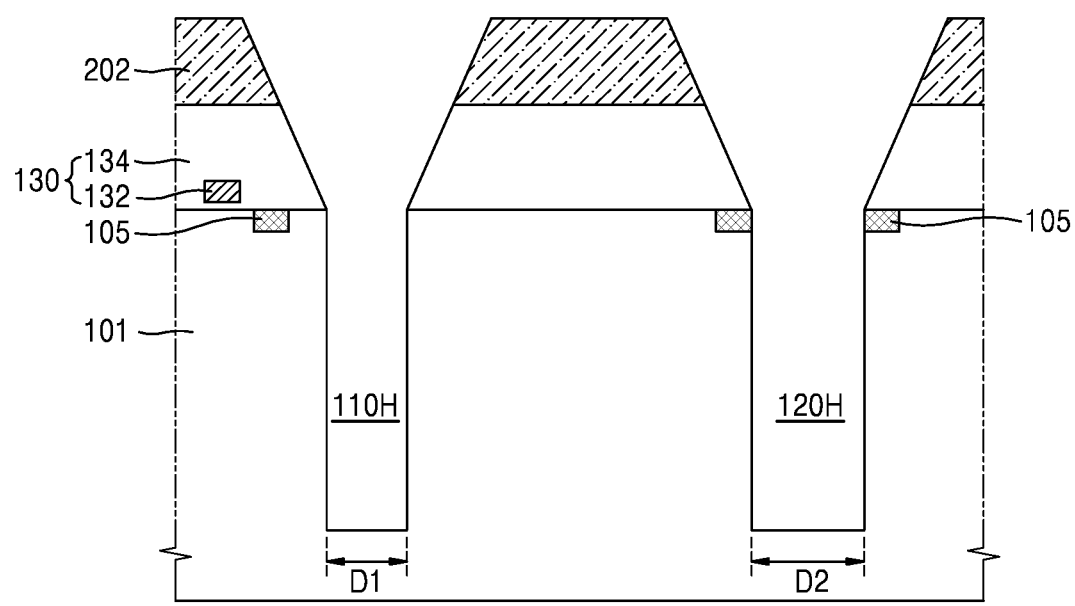

Referring to FIG. 15F, the preliminary recess PR and the semiconductor substrate 101 at the second position may be simultaneously etched to form a via hole (referred to as a first via hole) 110H for a first via structure and a via hole (referred to as a second via hole) 120H for a second via structure. The first via hole and the second via hole may each have a second depth that is greater than the first depth H1.

As described with reference to FIG. 11G, the above-described DRIE process may be performed to form the first via hole 110H and the second via hole 120H. The first via hole 110H may have a first diameter D1, and the second via hole 120H may have a second diameter D2. The second diameter D2 may be greater than the first diameter D1. Since the second diameter D2 is greater than the first diameter D1, an etch rate may be greater for the second via hole 120H than for the first via hole 110H. Although an etch rate of the semiconductor substrate 101 is lower at the first via hole 110H than at the second via hole 120H, since the preliminary recess PR is previously formed, the first via hole 110H may have the same depth as the second via hole 120H at an etch stop point in time.

Next, subsequent processes may be performed in the same manner as described with reference to FIGS. 11H to 11K.

Figure 16:
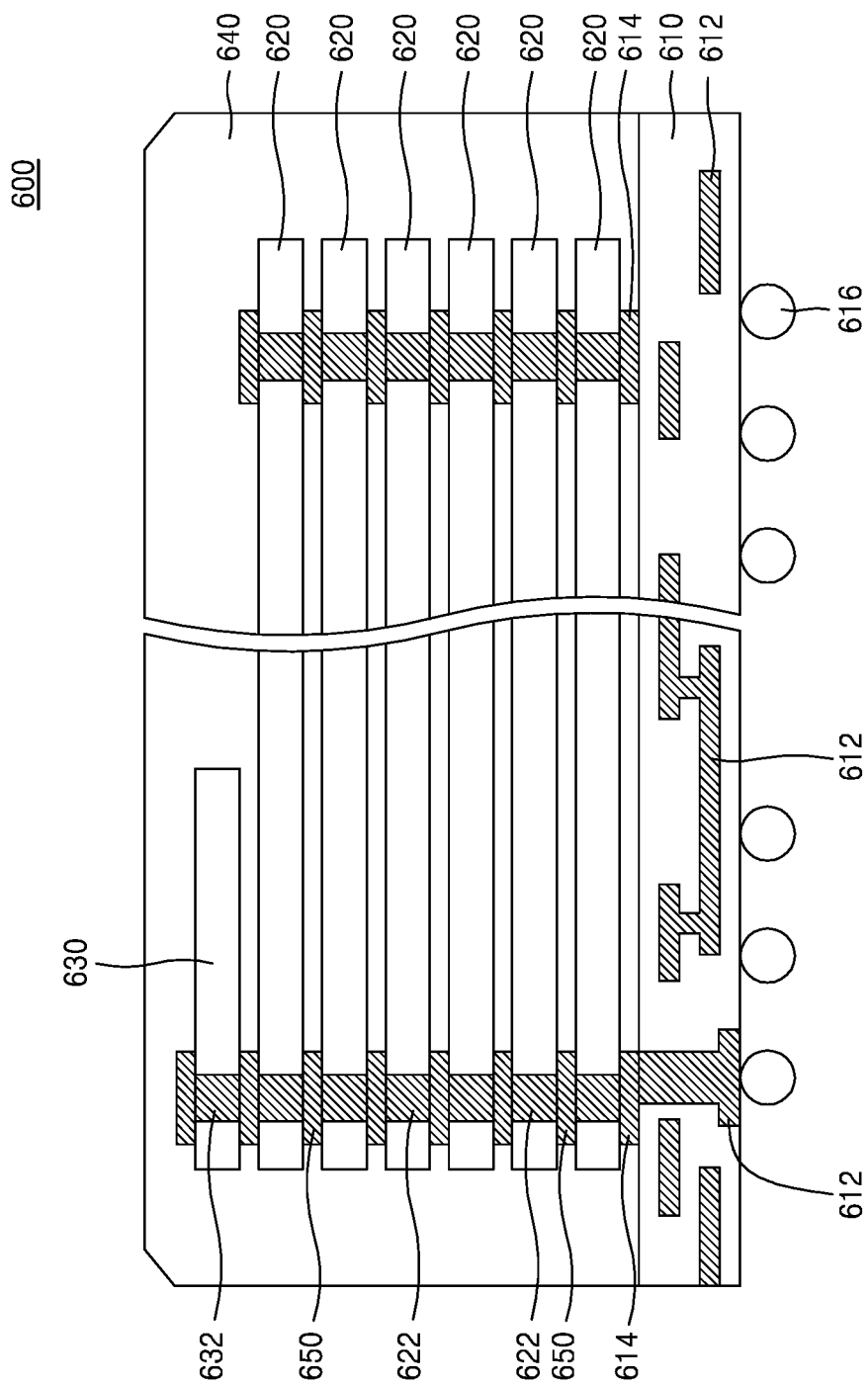
FIG. 16 is a cross-sectional view illustrating key components of a semiconductor package according to exemplary embodiments of the present disclosure.

FIG. 16 is a cross-sectional view of essential components of a semiconductor package 600 according to exemplary embodiments of the present disclosure.

Referring to FIG. 16, the semiconductor package 600 may include a plurality of semiconductor chips 620 sequentially stacked on a package substrate 610. A control chip 630 may be located over and connected to the plurality of semiconductor chips 620. A stack structure including the plurality of semiconductor chips 620 and the control chip 630 may be encapsulated, together, by an encapsulant 640, such as a thermosetting resin, on the package substrate 610. Although a structure in which six semiconductor chips 620, in addition to the control chip 630, are vertically stacked is illustrated in FIG. 16, the number and stacked direction of the semiconductor chips 620 are not limited thereto. The number of the semiconductor chips 620 may be determined to be less or more than six, as needed. The plurality of semiconductor chips 620 may be arranged in a lateral direction or may be arranged in a connection structure corresponding to a combination of a vertical mounting structure and a lateral mounting structure. In some exemplary embodiments of the present disclosure, the control chip 630 may be omitted.

The package substrate 610 may include a flexible printed circuit board (PCB), a rigid PCB, or a combination thereof. The package substrate 610 may include substrate inner interconnections 612 and connection terminals 614. The connection terminals 614 may be formed on one surface of the package substrate 610. Solder balls 616 may be formed on another surface of the package substrate 610. The connection terminals 614 may be electrically connected to the solder balls 616 through the substrate inner interconnections 612. In some exemplary embodiments of the present disclosure, the solder balls 616 may be replaced by conductive bumps or lead grid arrays (LGAs).

The semiconductor package 600 may include via structure units 622 and 632. The via structure units 622 and 632 may be electrically connected to the connection terminals 614 of the package substrate 610 by coupling members 650, such as bumps. In some exemplary embodiments of the present disclosure, the via structure unit 632 may be omitted from the control chip 630.

At least one of the plurality of semiconductor chips 620 and the control chip 630 may include at least one of the semiconductor devices 100 described with reference to FIGS. 1 to 9 and 14.

Each of the plurality of semiconductor chips 620 may include a system LSI, flash memory, dynamic random access memory (DRAM), static RAM (SRAM), electrically erasable and programmable read-only memory (EEPROM), phase-change RAM (PRAM), magnetic RAM (MRAM), or resistive RAM (RRAM). For example, the control chip 630 may include logic circuits, such as serializer/deserializer (SER/DES) circuits.

While exemplary embodiments of the inventive concept have been particularly shown and described with reference to the figures, it will be understood that various changes in form and details may be made therein without departing from the spirit and scope of the disclosure.

What is claimed is:

1. A semiconductor device, comprising:
a semiconductor substrate including an active surface;
semiconductor elements disposed on the active surface;
an interlayer insulating film disposed on the semiconductor substrate;
a first via structure passing through the semiconductor substrate, the first via structure having a first diameter; and
a second via structure passing through the semiconductor substrate, the second via structure having a second diameter that is greater than the first diameter,
wherein the first via structure comprises:
a head portion having a first width in a direction parallel to an upper surface of the semiconductor substrate;
a body portion having a second width in the direction parallel to the upper surface of the semiconductor substrate, wherein the second width is less than the first width; and
a step portion that is in contact with the interlayer insulating film, the step portion being disposed between the head portion and the body portion,
wherein a lower surface of the head portion is substantially parallel to the upper surface of the semiconductor substrate,
wherein the first via structure comprises a first via insulating film having a substantially uniform thickness along a sidewall of a via hole and a first barrier film having a substantially uniform thickness along a sidewall of the first via insulating film, and
wherein the sidewall of the via hole of the first via structure comprises at least one undercut portion having a protruding shape in the semiconductor substrate and the first barrier film has a protruding shape corresponding to the undercut portion.

2. The semiconductor device of claim 1, wherein the second via structure does not comprise a step portion that is in contact with the interlayer insulating film.

3. The semiconductor device of claim 1, wherein the first barrier film has a first barrier width at the head portion and the first barrier film has a second barrier width at the body portion, and the second barrier width is less than the first barrier width.

4. The semiconductor device of claim 1, wherein the interlayer insulating film is in contact with both a side surface and the lower surface of the head portion.

5. The semiconductor device of claim 4, wherein the interlayer insulating film is in contact with a side surface of an upper portion of the body portion.

6. The semiconductor device of claim 1, wherein the second via structure passes through a device isolation film in the semiconductor substrate.

7. The semiconductor device of claim 6, wherein the device isolation film through which the second via structure passes surrounds the second via structure in a lateral direction over a partial height of the second via structure.

8. The semiconductor device of claim 1, wherein the first via structure includes a signal via structure, and the second via structure includes a power via structure.

9. The semiconductor device of claim 1, further comprising:
a third via structure configured to pass through the semiconductor substrate, the third via structure having a third diameter that is greater than the second diameter,
wherein a sidewall of a via hole of the first via structure comprises at least two undercut portions.

10. The semiconductor device of claim 9, wherein the third via structure passes through a device isolation film in the semiconductor substrate.

11. The semiconductor device of claim 1, wherein a planar shape of the head portion is circular, polygonal, or elliptical.

12. A semiconductor device, comprising:
a semiconductor substrate;
an interlayer insulating film disposed on the semiconductor substrate;
a signal via structure passing through both the semiconductor substrate and the interlayer insulating film; and
a power via structure passing through both the semiconductor substrate and the interlayer insulating film,
wherein the power via structure passes through a device isolation film in the semiconductor substrate, wherein the signal via structure comprises:
a head portion having a first width in a direction parallel to an upper surface of the semiconductor substrate; and
a body portion having a second width in the direction parallel to the upper surface of the semiconductor substrate, the second width being smaller than the first width,
wherein a lower surface of the head portion is substantially parallel to the upper surface of the semiconductor substrate,
wherein the signal via structure comprises a first via insulating film having a substantially uniform thickness along a sidewall of a via hole and a first barrier film having a substantially uniform thickness along a sidewall of the first via insulating film, and
wherein the sidewall of the via hole of the signal via structure comprises at least one undercut portion having a protruding shape in the semiconductor substrate and the first barrier film has a protruding shape corresponding to the undercut portion.

13. The semiconductor device of claim 12, wherein the signal via structure has a first diameter in the semiconductor substrate, and the power via structure has a second diameter in the semiconductor substrate, and the second diameter is greater than the first diameter.

14. The semiconductor device of claim 12, wherein the signal via structure has different diameters at an upper portion and a lower portion of the at least one undercut portion.

15. The semiconductor device of claim 12, wherein the device isolation film through which the power via structure passes surrounds the power via structure over a partial height of the power via structure in a direction perpendicular to the upper surface of the semiconductor substrate.

16. The semiconductor device of claim 12, wherein the signal via structure has a step portion that is in contact with the interlayer insulating film.

17. The semiconductor device of claim 16, wherein the power via structure does not comprise a step portion.

18. A semiconductor package, comprising:
a first semiconductor device comprising a cell region and a peripheral region; and
a second semiconductor device stacked on the first semiconductor device, the second semiconductor device being electrically connected to the first semiconductor device,
wherein the first semiconductor device comprises a semiconductor substrate and an interlayer insulating film disposed on the semiconductor substrate,
wherein the first semiconductor device comprises a first via structure and a second via structure in the peripheral region,
wherein the first via structure passes through the semiconductor substrate and the first via structure has a first diameter, and the second via structure passes through the semiconductor substrate and has a second diameter, which is greater than the first diameter,
wherein a sidewall of a via hole of the first via structure comprises at least one undercut portion having a protruding shape in the semiconductor substrate,
wherein the first via structure comprises:
a head portion having a first width in a direction parallel to an upper surface of the semiconductor substrate; and
a body portion having a second width in the direction parallel to the upper surface of the semiconductor substrate,
wherein the second width is less than the first width,
wherein a lower surface of the head portion is substantially parallel to the upper surface of the semiconductor substrate,
wherein the first via structure comprises a first via insulating film having a substantially uniform thickness along a sidewall of a via hole and a first barrier film having a substantially uniform thickness along a sidewall of the first via insulating film, and
wherein the first barrier film has a protruding shape corresponding to the undercut portion.

* * * * *